(12) United States Patent
Isozumi et al.

(10) Patent No.: US 11,581,049 B2
(45) Date of Patent: Feb. 14, 2023

(54) SYSTEM AND METHODS FOR PROGRAMMING NONVOLATILE MEMORY HAVING PARTIAL SELECT GATE DRAINS

(71) Applicant: SanDisk Technologies LLC, Addison, TX (US)

(72) Inventors: Kazuki Isozumi, Kuwana (JP); Parth Amin, Fremont, CA (US); Sayako Nagamine, Yokkaichi (JP); Anubhav Khandelwal, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/335,909

(22) Filed: Jun. 1, 2021

(65) Prior Publication Data
US 2022/0383967 A1 Dec. 1, 2022

(51) Int. Cl.
| | | |
|---|---|---|
| *G11C 16/34* | (2006.01) | |
| *G11C 16/10* | (2006.01) | |
| *G11C 29/52* | (2006.01) | |
| *G11C 16/08* | (2006.01) | |
| *G11C 29/12* | (2006.01) | |

(52) U.S. Cl.
CPC .......... *G11C 16/3459* (2013.01); *G11C 16/08* (2013.01); *G11C 16/10* (2013.01); *G11C 29/12* (2013.01); *G11C 29/52* (2013.01)

(58) Field of Classification Search
CPC ..... G11C 16/3459; G11C 16/08; G11C 16/10; G11C 29/12; G11C 29/52
USPC ........................................ 365/185.22, 185.24
See application file for complete search history.

(56) References Cited

U.S. PATENT DOCUMENTS

| | | | | | |
|---|---|---|---|---|---|
| 6,058,042 | A | * | 5/2000 | Nobukata | .......... G11C 16/3459 365/185.12 |
| 7,602,648 | B2 | * | 10/2009 | Lee | .................... G11C 16/3454 365/185.24 |
| 9,779,820 | B1 | * | 10/2017 | Lee | ......................... G11C 16/32 |
| 10,535,401 | B2 | | 1/2020 | Lin et al. | |
| 10,790,003 | B1 | * | 9/2020 | Chen | ................ G11C 11/40626 |
| 11,183,245 | B1 | * | 11/2021 | Chen | ...................... G11C 16/08 |
| 11,232,824 | B1 | * | 1/2022 | Gong | ................... G11C 13/003 |
| 2007/0180156 | A1 | * | 8/2007 | Irish | .................... G06F 12/1027 710/5 |
| 2007/0180158 | A1 | * | 8/2007 | Irish | .................... G06F 12/1027 710/5 |

(Continued)

*Primary Examiner* — Michael T Tran
(74) *Attorney, Agent, or Firm* — Dickinson Wright PLLC; Steven C. Hurles

(57) ABSTRACT

Apparatus and methods are described to reduce program disturb for a memory string with a partial select gate drain, which is partially cut by a shallow trench. The memory string with a partial select gate drain is linked with a neighboring full select gate drain that during its programming can cause a program disturb in the memory string with a partial select gate drain. The bias voltage applied to the selected full select gate drain can be controlled from a high state for low memory program states to a lower state for the high memory program states. The high data states may cause program disturb. The reduction in the bias voltage can match a reduction in the bias voltage applied to the bit lines to reduce the program disturb while providing adequate signal to program the high states on the memory string of the full select gate drain.

20 Claims, 15 Drawing Sheets

(56) References Cited

U.S. PATENT DOCUMENTS

| | | | |
|---|---|---|---|
| 2007/0198756 A1* | 8/2007 | Norgaard | G06F 1/14 |
| | | | 710/39 |
| 2009/0323429 A1* | 12/2009 | Lee | G11C 11/5628 |
| | | | 365/185.18 |
| 2010/0232214 A1* | 9/2010 | Papaix | G11C 11/412 |
| | | | 348/308 |
| 2011/0225337 A1* | 9/2011 | Byrne | G06F 13/4027 |
| | | | 710/306 |
| 2013/0250670 A1* | 9/2013 | Nakai | G11C 11/161 |
| | | | 365/158 |
| 2014/0063972 A1* | 3/2014 | Maeda | G11C 16/10 |
| | | | 365/185.22 |
| 2014/0085989 A1* | 3/2014 | Fukuzumi | G11C 16/08 |
| | | | 365/185.23 |
| 2014/0195790 A1* | 7/2014 | Merten | G06F 9/3844 |
| | | | 712/239 |
| 2014/0368505 A1* | 12/2014 | Bavoil | G06T 15/005 |
| | | | 345/426 |
| 2016/0322103 A1* | 11/2016 | Kawai | G11C 13/0069 |
| 2018/0061115 A1* | 3/2018 | Harris | H04N 13/279 |
| 2019/0237135 A1* | 8/2019 | Madhavan | G11C 8/16 |
| 2019/0267092 A1* | 8/2019 | Joe | G11C 16/32 |
| 2020/0194070 A1* | 6/2020 | Lee | G11C 16/0483 |
| 2021/0096948 A1* | 4/2021 | Gopalakrishnan | G11C 29/74 |
| 2021/0183458 A1* | 6/2021 | Lee | G11C 16/30 |
| 2022/0215890 A1* | 7/2022 | Chen | G11C 16/10 |

\* cited by examiner

SYSTEM AND METHODS FOR PROGRAMMING NONVOLATILE MEMORY HAVING PARTIAL SELECT GATE DRAINS

BACKGROUND

The present technology relates to the operation of memory devices.

Semiconductor memory devices have become more popular for use in various electronic devices, such as cellular telephones, digital cameras, personal digital assistants, mobile computing devices, non-mobile computing devices and other devices. A non-volatile memory allows information to be stored and retained even when the non-volatile memory is not connected to a source of power (e.g., a battery).

SUMMARY

One aspect of the present disclosure is related to an apparatus that includes a plurality of non-volatile memory cells which are configured to be programmed to multiple states. A first group of the memory cells include full select gate drains, and a second group of the memory cells have partial select gate drains. The apparatus further includes a memory controller that is operably connected to the plurality of memory cells. The memory controller is configured to designate as selected a first string of non-volatile memory cells for a program operation with the first string being part of the first group. The memory controller is further configured to designate as unselected a second string of non-volatile memory cells for a program operation with the second string being part of the second group with the second string being adjacent the first string. The memory controller is also configured to bias the second string to zero volts, bias the full select gate drains of the first string to a full voltage level at lower program states for the first string, and bias the full select gate drain of the first string to a lower voltage level than the full voltage level at higher program states for the first string. The higher program states are higher than the lower program states to reduce program disturb on the second string.

According to another aspect of the present disclosure, the memory controller is configured to bias a selected bitline to address a memory cell in the first string at a lower voltage for the higher programming states and a higher voltage for the lower programming states.

According to yet another aspect of the present disclosure, the memory controller is configured to lower a bias voltage on the selected bitline by a difference between the higher program state and the lower program state applied to the full select gate drain of the first string.

According to still another aspect of the present disclosure, the memory controller is configured to quick pass write data to the memory cell addressed by the selected bitline with a reduced quick pass write bitline voltage compared to a non quickpass write bitline voltage and to reduce a bias voltage to the full select gate drain by a similar voltage as the difference between the reduced quick pass write bitline voltage compared to the non quickpass write bitline voltage.

According to a further aspect of the present disclosure, the memory controller applies the full voltage level to the lower program states, reduces bias voltage on the selected bitline for middle program states to a middle bias voltage level and further reduces bias voltage to the lower voltage level on the selected bitline for the high program states.

According to yet a further aspect of the present disclosure, the memory cells are quad level cells and the lower program states include at least an A program state and a B program state, the middle program states include at least a D program state, and the high program states include at least a G program state.

According to still a further aspect of the present disclosure, the full voltage level is 2.4 volts, the middle voltage level is 2.3 volts, and the lower voltage level is 2.0 volts.

According to another aspect of the present disclosure, the memory controller is configured to reduce the bit line voltage from a full level at programming loops for the lower program states to a middle bit line programming voltage for the middle program state and further reduce the bit line programming voltage for the highest program states.

According to yet another aspect of the present disclosure, the memory controller is configured to reduce the bias voltage level at the unselected partial SGD by a similar value as a voltage reduction applied to the bit lines in a quick pass write programming loop.

According to still another aspect of the present disclosure, the partial select gate drains are semicircular and the full select gate drains are circular.

Another aspect of the present disclosure is related to a nonvolatile memory control method that reduces program disturb to a neighboring partial select gate drain to the full select gate drain by applying multiple voltage levels. The method includes the step of applying a first voltage level to a full select gate drain as part of a memory string to program low data states. The method continues with the step of applying a second voltage level to the full select gate drain as part of the memory string to program intermediate data states, the second voltage level being less than the first voltage level by a first voltage difference. The method proceeds with the step of applying a third voltage level to the full select gate drain as part of the memory string to program a high data state, the third voltage level being less than the second voltage level by a second voltage difference. The method continues with the step of applying bias voltages to bitlines that reduce by the first voltage difference and the second voltage difference from programming the intermediate data states and the high data state, respectively.

According to another aspect of the present disclosure, the first voltage difference is about 0.2 volts and the second voltage difference is about 0.4 volts.

According to yet another aspect of the present disclosure, the method further includes the step of performing quick pass write using the first voltage level, the second voltage level, and the third voltage level.

According to still another aspect of the present disclosure, the method further includes the step of applying the first voltage level, the second voltage level, and the third voltage level to a single full select gate drain and the remaining select gate drain being unselected with the partial select gate drain to reduce program disturb due to an uncovered channel in the partial select gate drain.

According to a further aspect of the present disclosure, the method further includes the step of applying a bitline voltage to a selected bitline connected to both the partial select gate drain and the full select gate drain.

Another aspect of the present disclosure, an apparatus is provided. The apparatus includes a plurality of non-volatile memory cells configured to be programmed to multiple states, a first group of the memory cells include full select gate drains (SGD) and a second group of the memory cells have semicircle select gate drains that are partially cut by a shallow trench etch. The apparatus further includes a memory controller operably connected to the plurality of memory cells. The memory controller is configured to apply a full program voltage level to a selected SGD during programming loops for lowest data states. The memory controller is further configured to apply an intermediate program voltage level to the selected SGD during programming loops for intermediate data states. The intermediate program voltage level is less than the full program voltage level. The memory controller is still further configured to apply a lower program voltage level to the selected SGD during programming loops for the lowest data states. The lowest program voltage level is less than the intermediate program level.

According to another aspect of the present disclosure, the memory controller is configured to reduce the voltage levels to the selected SGD by about a same voltage reduction applied to the bit line.

According to yet another aspect of the present disclosure, the memory controller is configured to reduce the bit line voltage by 0.2 volts from the lowest data states to the intermediate data states and 0.4 volts from the intermediate data states to the highest data states.

According to still another aspect of the present disclosure, the memory controller is configured to set the intermediate voltage at 2.2 volts.

According to a further aspect of the present disclosure, the memory controller is configured to set the lowest program voltage to 2.0 volts.

BRIEF DESCRIPTION OF THE DRAWINGS

A more particular description is included below with reference to specific embodiments illustrated in the appended drawings. Understanding that these drawings depict only certain embodiments of the disclosure and are not, therefore, to be considered limiting of its scope, the disclosure is described and explained with additional specificity and detail through the use of the accompanying drawings, in which.

DETAILED DESCRIPTION

Figure 1:
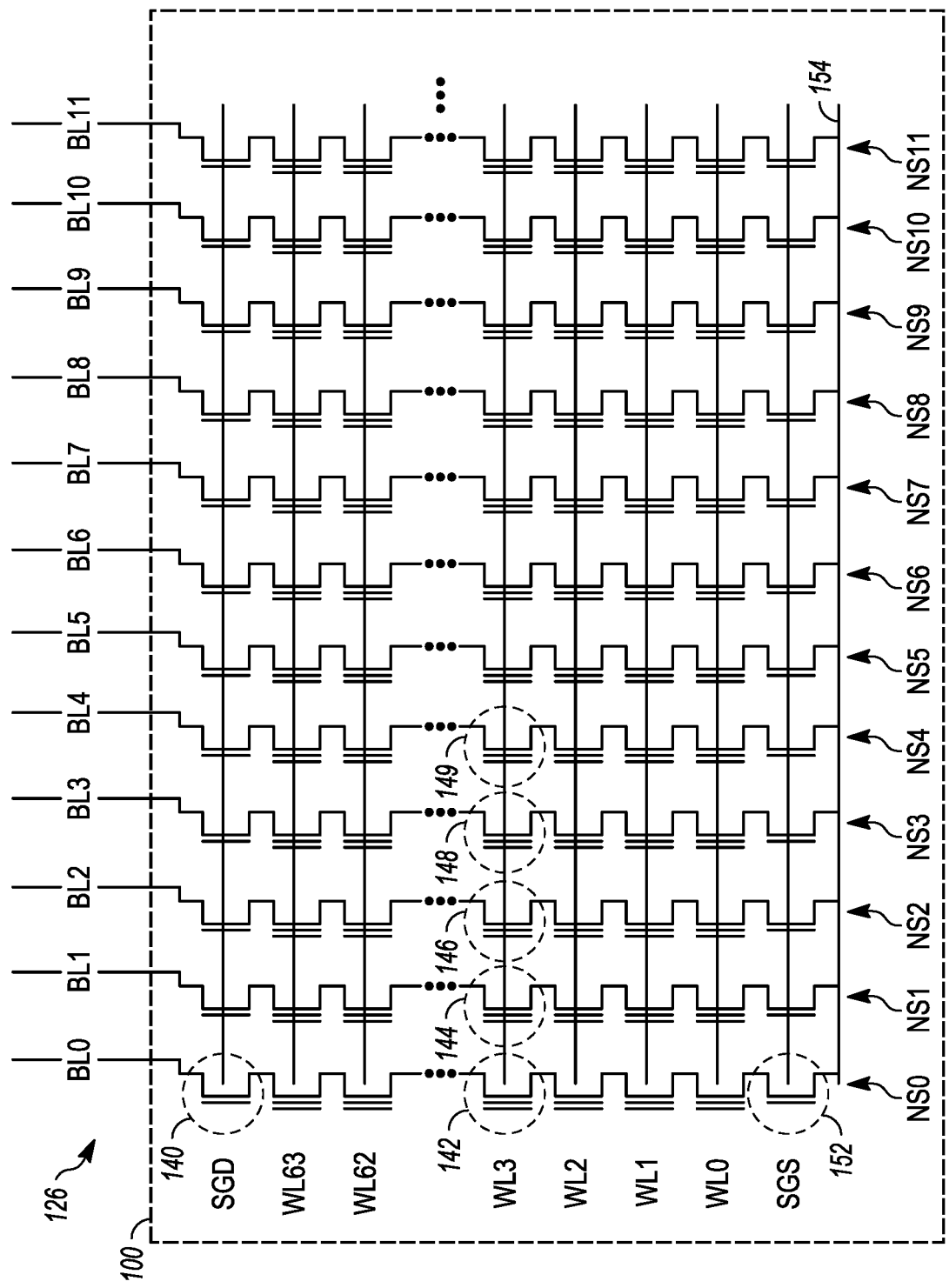
FIG. 1 illustrates an embodiment of an array of memory cells including bit and word lines according to an example embodiment.

Systems and methods are described for improving program disturb operations. In nonvolatile memory systems arranged with memory strings accessed by select gate drain (SGD) transistor at one end of the string and usually by a select gate source transistor at the other end of the string, program disturb can be reduced by reducing the voltage at the select gate drain during programming, e.g., at the higher programmed data states for a multilevel memory cell. The higher programming states can be the highest data state, such as the G data state in a three-bits per memory cell (TLC) memory device or the F and G data states in a four-bits per memory cell (QLC) memory device. The program disturb can occur with at an unselected memory string adjacent a selected memory string. This can be a problem with smaller scale structures, such as structures that has a semicircle SGD, which arranges the strings closer together to increase memory storage per unit area.

Scaling of memory has improved by using dummy memory holes and cutting the vertical memory hole to separate groups of strings. However, eliminating entire vertical strings reduces the benefits of scaling, to some extent. The use of partial cuts at select gate drain to separate the strings allows for greater scaling without losing entire strings; however, this can increase program disturb. The partial cuts do not cut down the vertical hole but instead cut the gap between vertical strings and result in partially cut SGD transistors at the top of a vertical string, i.e., the partial SGDs are in the form of a semicircle. This type of partial SGD will increase program disturb at higher program data states, i.e. data states at higher threshold voltages.

In an example embodiment, a memory structure includes both uncut SGDs (e.g., full circle) and cut SGDs (e.g., semicircle) and a memory controller to control the bias voltages applied to the selected SGDs and bit lines to reduce program disturb. The memory controller can reduce the bias voltage applied to the selected SGD that maintains programming higher data states in memory cells on the selected SGD while reducing the program disturb on the neighboring unselected partial SGD. The higher program data states can be programmed using a lower bias applied to the selected SGD while lowering the voltage on the associated bitline for the addressed memory cell, which reduces program disturb on unselected SGD strings. In an example, the voltage difference on the selected memory cell remains the same with the lowered bias on selected SGD and bitline. The lowered selected SGB bias reduces program disturb on neighboring unselected memory cells connected to the unselected SGD.

A programming operation for a group of memory cells typically involves providing the memory cells in an erased state and then applying a series of program pulses to the memory cells. Each program pulse is provided in a program loop, also referred to as a program-verify iteration. For example, the program pulse may be applied to a word line that is connected to control gates of the memory cells while a bias voltage is applied to the SGD transistor at the end of the vertical string. In one approach, incremental step pulse programming is performed, in which the program pulse amplitude is increased by a step size in each program loop. Each loop can be program state in the memory cell. Verify operations may be performed after each program pulse to determine whether the memory cells have completed programming. When programming has completed for a memory cell, the memory cell can be locked out (inhibited) from further programming while programming continues for other memory cells in subsequent program loops. Subsequent verify steps can be skipped when the current verify operation confirms that the memory cells are in a quick pass write (QPW) and with the low voltage greater than the threshold voltage. However, the highest program data states require the highest program voltage, which can increase program disturb in neighboring strings, e.g., strings with a partial SGD. The memory controller can conduct programming operations with the usual programming loops but with the bias voltage on the selected SGD to help at a program value, e.g., a constant select voltage. The memory controller at the higher data states (such as the F and G data states in a QLC memory cell) can reduce the bias voltage applied to the selected SGD and reduce the bitline voltage to reduce program disturb. In an example, the memory controller can maintain a same difference between the bias voltage applied to the selected SGD and the bias voltage on the bitline. This allows programing of the addressed memory cell to the higher data state while reducing the program disturb on neighboring strings with the partial SGD.

Each memory cell may be associated with a data state according to write data in a program command. As used herein, a "data state" is a detectable characteristic of a memory cell (e.g., a threshold voltage of a NAND memory cell, a resistance of a ReRAM memory cell, a magnetization state of a magnetoresistive random access memory) that may be used to represent a data value, such as a binary data value, including more than one binary bit. More than one binary bit is stored in multilevel memory cells. As used herein, the detectable characteristic of a memory cell used to represent a data value is referred to as a "programming characteristic." Based on write data in a program command, a memory cell will either remain in the erased state or be programmed to a data state (a programmed data state) different from the erased state. The detected voltage in the memory cell can determine its state.

For example, in a two-bit per cell (MLC) memory device, there are four data states including the erased state and three programmed data states. In a three-bit per cell (TLC) memory device, there are eight data states including the erased state and seven programmed data states. In some embodiments, the states of a QLC memory device can be referred to as the Er, A, B, C, D, E, F, and G data states with the G data state being at the highest threshold voltage and being the highest data state. In other embodiments, the states can be referred to by other nomenclatures, e.g., Er, S1, S2, S3, etc. In a four-bit per cell (QLC) memory device, there are sixteen data states including the erased state and fifteen programmed data states. These states can be set by programming a voltage level into the cell.

When a program command is issued, the write data are stored in data latches associated with the memory cells. For example, in a two-bit per cell memory device, each memory cell is associated with two data latches (e.g., DL1, DL2) that store the two-bit write data for the memory cell. Likewise, in a three-bit per cell memory device, each memory cell is associated with three data latches (e.g., DL1, DL2, DL3) that store the three-bit write data for the memory cell. Similarly, in a four-bit per cell memory device, each memory cell is associated with four data latches (e.g., DL1, DL2, DL3, DL4) that store the four-bit write data for the memory cell. Examples of data latches can be found in U.S. Pat. No. 10,535,401, which is incorporated by reference herein.

During programming, the data latches of a memory cell can be read to determine the data state to which the cell is to be programmed. For NAND memory cells, each programmed data state is associated with a verify voltage. A NAND memory cell with a given data state is considered to have completed programming when a sensing operation determines the threshold voltage (Vt) of the memory cell is above the associated verify voltage. A sensing operation can determine whether a memory cell has a Vth above the associated verify voltage by applying the associated verify voltage to the control gate and sensing a current through the memory cell. If the current is relatively high, this indicates the memory cell is in a conductive state, such that the Vt is less than the control gate voltage. If the current is relatively low, this indicates the memory cell is in a non-conductive state, such that the Vt is above the control gate voltage.

In addition to the verify operations described above, a bitscan operation also may be performed to determine when programming is complete for a group of memory cells. As used herein, a "bitscan" is an operation that counts a number of memory cells whose programming characteristic has not shifted above a particular verify voltage level for a particular data state. For NAND memory cells, a bitscan is an operation that counts a number of memory cells whose threshold voltage has not shifted above a particular verify voltage level for a particular data state. For example, a state N bitscan is a count of a number of state N memory cells whose threshold voltage has not shifted above a verify voltage level for state N. Likewise, a state (N+1) bitscan is a count of a number of state (N+1) memory cells whose threshold voltage has not shifted above a verify voltage level for state (N+1), and so on. For simplicity, the following discussion will refer to bitscan operations for NAND memory cells although bitscan operations also may be used for other non-volatile memory technologies. According to embodiments of the present disclosure these bitscan counts to trigger the verify operation to skip to the next program level in the same programming loop or program verify in subsequent program loops. The verify voltage can be a low voltage value or a high voltage level with the low voltage level being less than the high voltage level. Verification of the memory cells can be considered complete when a count of memory cells in a quick pass write "QPW" state exceeds a first threshold count value and when a low voltage level verify count exceeds a second threshold count value. Examples described herein attempt to preserve the quick pass write operations while reducing the program disturb of adjacent unselected SGD related memory cells.

Programming of memory cells for a particular data state may be considered complete if the bitscan count for a particular state is less than a predetermined value. In some embodiments, the predetermined value is less than a number of read errors that can be corrected by an error correction code engine. In other words, programming of memory cells for a particular data state may be considered complete even though all memory cells that are to be programmed to the particular data state do not have threshold voltages (Vt) that have shifted above a verify voltage level for the data state, as long as the number of "failing" memory cells is less than a number of read errors that can be corrected by an error correction code engine. Moreover, the count of memory cells can be used to trigger a skip to the next data state verify operation.

Bitscan calculations typically are performed based on results of verify operations for a particular program-verify iteration. In particular, following application of a program pulse, verify operations may be performed for one or more data states, and then the results of the verify operations may be used to calculate the bitscan for a particular data state.

In some programming techniques, following each program pulse, a bitscan is performed for a single data state (a "single-state bitscan"), and bitscans for higher data states are not performed until the bitscan count for the lower data state is less than the threshold value. Under some circumstances, performing such single state bitscans may result in extra verify operations being performed and extra program pulses being applied to the memory cells, even though the memory cells have actually completed programming. This is undesirable because time is consumed performing verify operations and applying unnecessary program pulses may cause program disturb.

In other programming techniques, following each programming pulse, a bitscan is performed for multiple (e.g., n) consecutive data states (an "n-state bitscan"). Under some circumstances, performing such n-state bitscans also may result in extra verify operations being performed and extra program pulses being applied to the memory cells, even though the memory cells have actually completed programming. As in the case of single state bitscans, this is undesirable because time is consumed performing verify operations and applying unnecessary program pulses may cause program disturb. Technology is described herein which can perform an n-state bitscan to perform program verify for more than one data state in a single iteration, e.g., when the bit count for a lower state exceeds a threshold value.

FIG. 1 depicts an embodiment of memory arranged as NAND flash memory cells in a memory array 126. As used herein, the term "memory" denotes semiconductor memory. Types of semiconductor memory include volatile memory and non-volatile memory. Non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), spin-transfer torque magnetic random access memory (STT-RAM or STT-MRAM), resistive random access memory (e.g., ReRAM or RRAM) and phase change memory (e.g., PRAM or PCM). Non-volatile memory can be BiCS memory architecture. Non-volatile memory includes one or more memory cells. A "memory cell" is an electronic device or component capable of storing electronic information. In an embodiment, non-volatile memory utilizes floating-gate transistors or charge trap transistors as memory cells. The ability to adjust the threshold voltage of a floating-gate transistor or charge trap transistor allows the transistor to act as a non-volatile storage element or memory cell, such as a single-level cell (SLC). However, in some cases more than one data bit per memory cell (e.g., a multi-level cell) can be provided by programming and reading multiple threshold voltages or threshold voltage ranges, including a MLC, TLC, QLC, and so forth.

The memory array 126 can include many blocks of memory. A "block of memory" is a set of memory cells. For example, a block of memory (e.g., an array of memory cells) includes memory cells arranged in word lines and bit lines. A "sub-block" of memory is a subset of a block of memory. A block of memory includes two or more sub-blocks. For instance, a sub-block is a subset of memory cells corresponding to a subset of the word lines of a block of memory. In an embodiment, a sub-block includes fifty word lines in a block of memory, where the block of memory includes more than fifty word lines. A sub-block can denote a physical sub-block, a logical sub-block, or both. In an embodiment, memory is structured as two-dimensional (2D) NAND. In another embodiment, memory is structured as three-dimensional (3D) NAND. The 3D NAND string can be U-shaped such that a first string forms one leg of the U-shape and a second string forms another leg of the U-shape. In an embodiment, one or more of the components described herein (e.g., memory die, memory, block, sub-block, memory cells, circuits, controllers, and/or non-volatile storage systems) are implemented with one or more elements (e.g., transistors, resistors, capacitors, inductors, and/or conductors) in integrated circuitry.

An illustrative block of memory (or block) 100, as shown in FIG. 1, includes a number of NAND strings NS0 to NS11 and respective bit lines (e.g., BL0 to BL11, which are shared among the blocks). Each NAND string is connected at one end to a drain select gate (SGD) 140, and the control gates of the drain select gates are connected via a common SGD line. Each NAND string is connected at its other end to a source select gate (SGS) 152 which, in turn, is connected to a common source line 154. For example, NS0 includes a source side select gate transistor 152 and a drain side select gate transistor 140. Example storage elements 142, 144, 146, 148, and 149 are in NS0 to NS4, respectively, and are connected to a word line WL3. For example, WL3 could be a selected word line which is selected for programming and the example storage elements can be selected storage elements which are selected for programming. Other storage elements connected to WL3 can also be selected storage elements. Sixty-four word lines, for example, WL0-WL63, extend between the source-side select gates and the drain-side select gates.

Other types of non-volatile memory in addition to NAND flash memory can also be used. For example, another type of memory cell useful in flash EEPROM systems utilizes a nonconductive dielectric material in place of a conductive floating gate to store charge in a nonvolatile manner. In an embodiment, triple layer dielectric formed of silicon oxide, silicon nitride, and silicon oxide (ONO) is sandwiched between a conductive control gate and a surface of a semi-conductive substrate above the memory cell channel. The cell is programmed by injecting electrons from the cell channel into the nitride, where they are trapped and stored in a limited region. This stored charge then changes the voltage level of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor. Another type of memory uses a metallic (conductive) charge storage element in a NAND architecture.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is obtained by separately reading binary states of the spatially separated charge storage regions within the dielectric. Other types of non-volatile memory are also known. In an alternative embodiment, resistance levels rather than threshold voltage levels can be stored and sensed.

Figure 2:
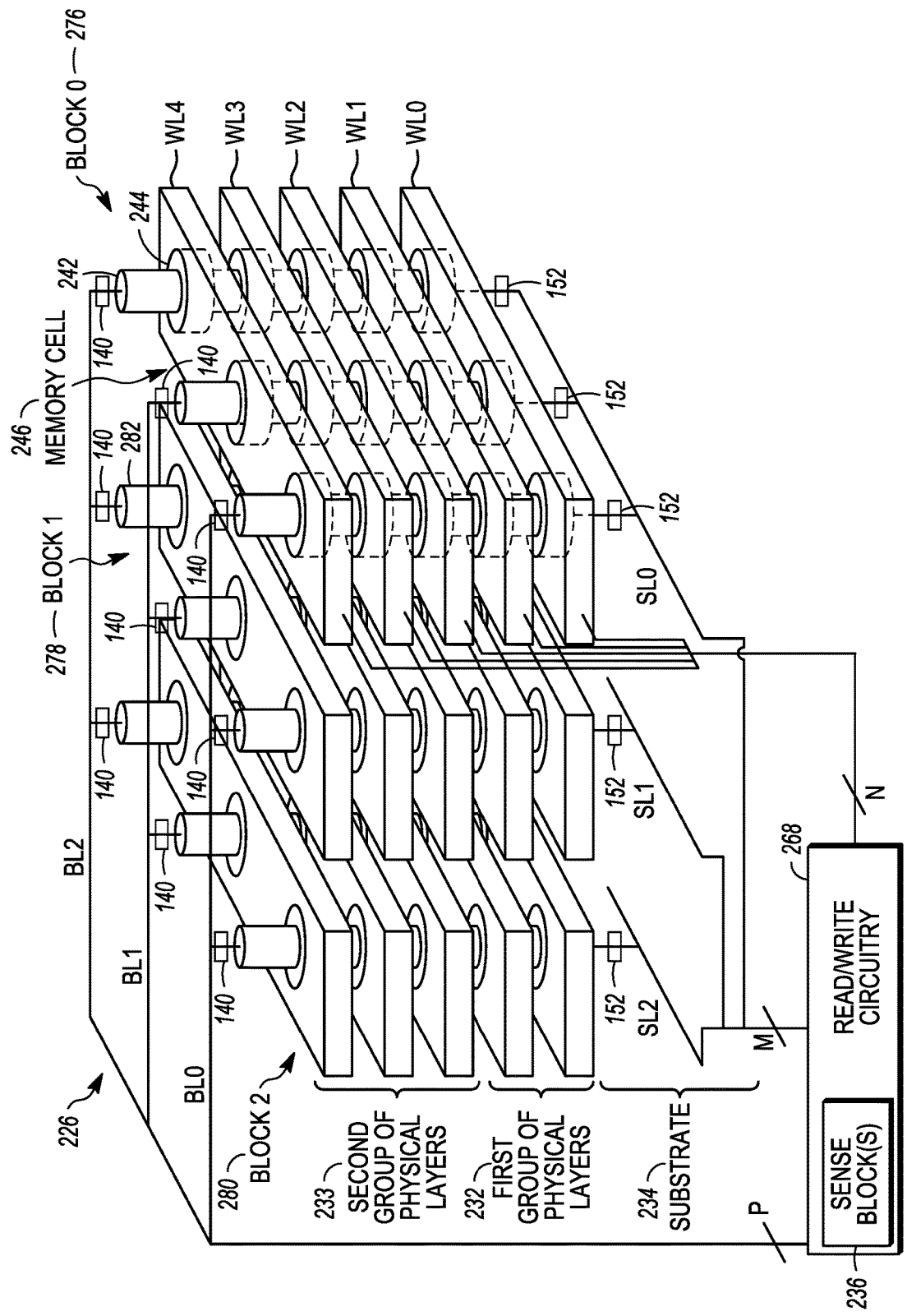
FIG. 2 is a diagram of a three-dimensional (3D) memory in a NAND configuration according to an example embodiment.

FIG. 2 illustrates an embodiment of 3D memory 226 in a NAND flash configuration. The 3D memory 226 includes multiple physical layers that are monolithically formed above a substrate 234, such as a silicon substrate. Storage elements (e.g., memory cells), such as a representative memory cell 246, are arranged in arrays in the physical layers.

The representative memory cell 246 includes a charge trap structure 244 between a word line/control gate WL4 and a conductive channel 242. Charge can be injected into or drained from the charge trap structure 244 via biasing of the conductive channel 242 relative to the word line WL4. For example, the charge trap structure 244 can include silicon nitride and can be separated from the word line WL4 and the conductive channel 242 by a gate dielectric, such as a silicon oxide. An amount of charge in the charge trap structure 244 affects an amount of current through the conductive channel 242 during a read operation of the memory cell 246 and indicates one or more bit values that are stored in the memory cell 246. The charge trap structure can determine the voltage level that will be verified in some embodiments of the present disclosure.

The 3D memory 226 includes multiple erase blocks, including a first block (block 0) 276, a second block (block 1) 278, and a third block (block 2) 280. Each block 276, 278, 280 includes a "vertical slice" of the physical layers that includes a stack of word lines, illustrated as a first word line WL0, a second word line WL1, a third word line WL2, a fourth word line WL3, and a fifth word line WL4. Multiple conductive channels (having a substantially vertical orientation, as shown in FIG. 2) extend through the stack of word lines. Each conductive channel is coupled to a storage element in each word line WL0-WL4, forming a NAND string of storage elements. FIG. 2 illustrates three blocks 276, 278, 280, five word lines WL0-WL4 in each block 276, 278, 280, and three conductive channels in each block 276, 278, 280 for clarity of illustration. However, the 3D memory 226 can have more than three blocks, more than five word lines per block, and more than three conductive channels per block.

Read/write circuitry 268 (which can be part of a controller) is coupled to the conductive channels via multiple conductive lines, illustrated as a first bit line BL0, a second bit line BL1, and a third bit line BL2 at a first end of the conductive channels (e.g., an end most remote from the substrate 234) and a first source line SL0, a second source line SL1, and a third source line SL2 at a second end of the conductive channels (e.g., an end nearer to or within the substrate 234). The read/write circuitry 268 is illustrated as coupled to the bit lines BL0-BL2 via "P" control lines, coupled to the source lines SL0-SL2 via "M" control lines, and coupled to the word lines WL0-WL4 via "N" control lines. Each of P, M, and N can have a positive integer value based on the specific configuration of the 3D memory 226. In the example shown in FIG. 2, P=3, M=3, and N=5.

In a particular embodiment, each of the bit lines BL0-BL2 and each of the source lines SL0-SL2 can be coupled to the same end (e.g., the first end or the second end) of different conductive channels. For example, a particular bit line BL0-BL2 can be coupled to a first end of a conductive channel 282, and a particular source line can be coupled to a first end of the conductive channel 242. A second end of the conductive channel 282 can be coupled (e.g., electrically coupled) to a second end of the conductive channel 242. Accordingly, the conductive channel 282 and the conductive channel 242 can be coupled in series and can be coupled to the particular bit line BL0-BL2 and the particular source line SL0-SL2, each of which is coupled to a particular NAND string.

Although each of the conductive channels, such as the conductive channels 242, 282, is illustrated as a single conductive channel, each of the conductive channels can include multiple conductive channels that are in a stack configuration. The multiple conductive channels in a stacked configuration can be coupled by one or more connectors. Additionally, an etch stop layer (not illustrated in FIG. 2) having a conductive connector coupled to physically proximate portions of a conductive channel can be included in the multiple conductive channels, such as between the first group of physical layers 232 and the second group of physical layers 233. Additionally, or alternatively, one or more sub-block gate transistors (not illustrated in FIG. 2) can be coupled between the first group of physical layers 232 and the second group of physical layers 233.

In an embodiment, the first group of physical layers 232 is an example of a first sub-block and the second group of physical layers 233 is an example of a second sub-block. For example, each sub-block (e.g., "word line-based" sub-blocks) can include memory cells corresponding to a subset of word lines WL0-WL4. In an alternative embodiment, each sub-block (e.g., "string-based" sub-blocks) can include memory cells corresponding to a subset of strings (e.g., NAND strings), and can have, for example, common source lines SL0-SL2, but not common bit lines BL0-BL2 or vice versa.

The read/write circuitry 268, which can be part of memory controller circuitry, facilitates and/or effectuates read and write operations performed on the 3D memory 226. For example, data can be stored to storage elements coupled to a word line WL0-WL4 and the read/write circuitry 268 can read bit values from the storage elements (e.g., memory cells) using one or more sense blocks 236. As another example, the read/write circuitry 268 can apply selection signals to control lines coupled to the SGD 140, SGS 152, the word lines WL0-WL4, the bit lines BL0-BL2, and the source lines SL0-SL2 to cause a programming voltage (e.g., a voltage pulse or series of voltage pulses) to be applied across selected storage element(s) of the selected word line (e.g., the fourth word line WL4). The read/write circuitry 226 can also perform verify operations as part of the programming operation.

The read/write circuitry 268 includes one or more sense blocks 236. The sense blocks 236 are utilized to read or sense one or more values stored in a memory cell. In one approach, one sense block 236 is provided for a group of NAND strings, each of which is coupled to a particular bit line BL0-BL2. For example, a sense block 236 is associated with BL0. Another sense block 236 is associated with BL1, and yet another sense block 236 is associated with BL2.

Each sense block 236 can include a memory controller (not illustrated in FIG. 2). Each sense block 236 also includes a sense module for each NAND string. Alternatively, a sense block 236 can be coupled to an interval of bit lines, such as even or odd numbered bit lines. The sense blocks can be used to sense the voltage level in an addressed cell. When the memory controller determines that subsequent sense operations are to be skipped, these sense blocks need not be energized or read during the skipped time periods.

During a read operation, a controller can receive a request from a host device, such as a computer, smartphone, or laptop computer. The controller can cause the read/write circuitry 268 to read bits from particular storage elements of the 3D memory 226 by applying appropriate signals to the control lines to cause storage elements of a selected word line to be sensed. Accordingly, the 3D memory 226 having multiple conductive channels in a stacked configuration can be configured to read from and write data to one or more storage elements.

One or more sub-blocks of memory cells 246 in an array of memory cells 246 can be coupled by a channel (e.g., a physical communication channel). In an embodiment, the channel comprises a bit line BL0-BL2 and/or a source line SL0-SL2.

Figure 3:
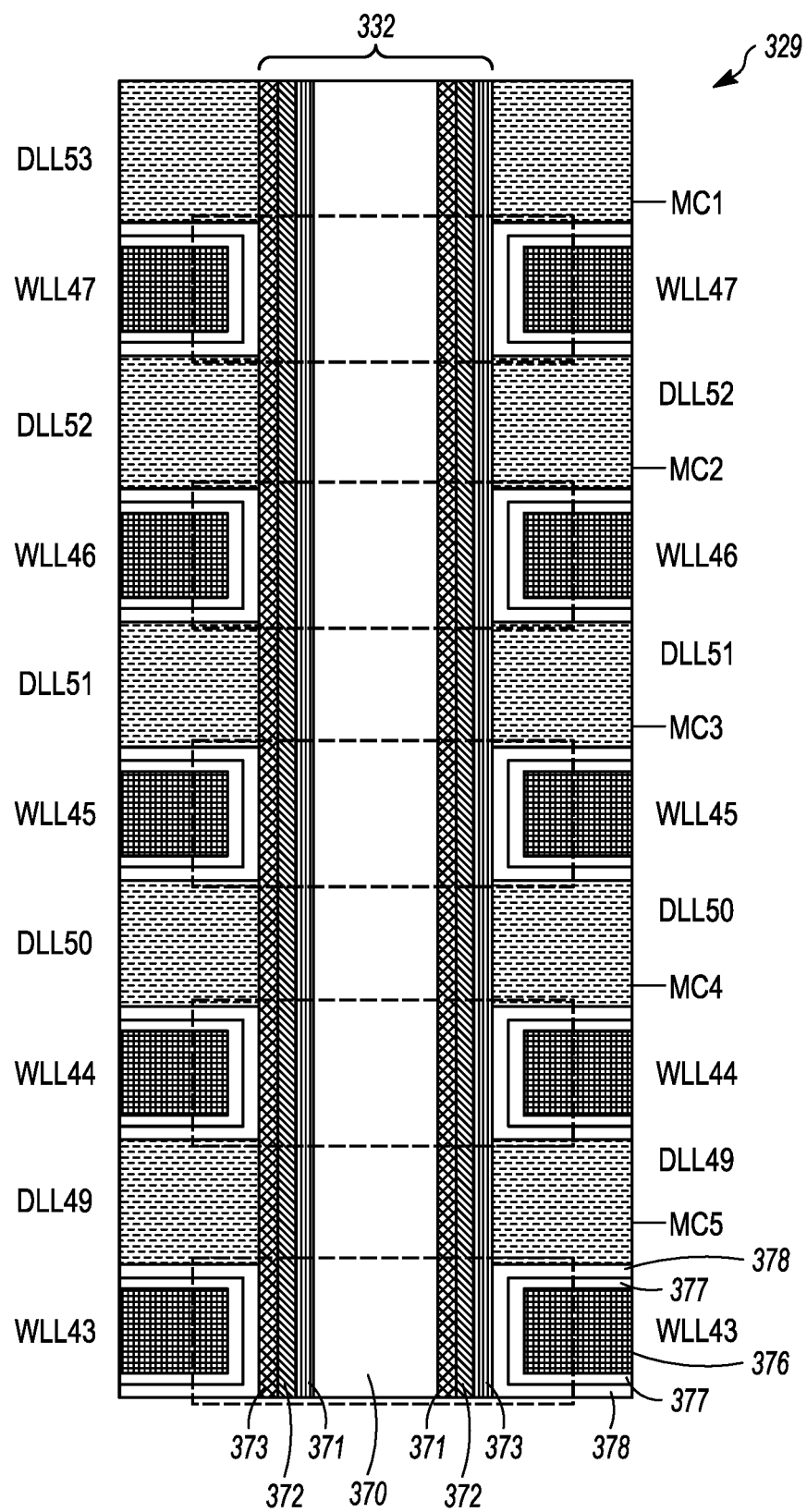
FIG. 3 is a schematic block diagram illustrating an embodiment of a 3D vertical memory structure according to an example embodiment.

FIG. 3 illustrates one embodiment of a cross-sectional view of a 3D, vertical memory structure or string 329. In one embodiment, the vertical column 332 is round and includes four layers; however, in other embodiments more or fewer than four layers can be included, and other shapes can be used (e.g., a "U" shape instead of an "I" shape or the like). In one embodiment, a vertical column 332 includes an inner core layer 370 that is made of a dielectric, such as SiO2. Other materials can also be used. Surrounding the inner core or inner core layer 370 is a polysilicon channel 371. Materials other than polysilicon can also be used. Note that it is the channel 371 that connects to the bit line. Surrounding the channel 371 is a tunneling dielectric 372. In one embodiment, the tunneling dielectric 372 has an ONO structure. Surrounding the tunneling dielectric 372 is a shared charge-trapping layer 373, such as (for example) Silicon Nitride. Other materials and structures can also be used. The technology described herein is not limited to any particular material or structure.

FIG. 3 depicts dielectric layers DLL49, DLL50, DLL51, DLL52, and DLL53, as well as word line layers WLL43, WLL44, WLL45, WLL46, and WLL47. Each of the word line layers includes a word line region 376 surrounded by an aluminum oxide layer 377, which is surrounded by a blocking oxide (SiO2) layer 378. The physical interaction of the word line layers with the vertical column 332 forms the memory cells. Thus, a memory cell, in one embodiment, comprises the channel 371, tunneling dielectric 372, charge-trapping layer 373 (e.g., shared with other memory cells), blocking oxide layer 378, aluminum oxide layer 377, and the word line region 376. In some embodiments, the blocking oxide layer 378 and aluminum oxide layer 377 can be replaced by a single layer of material with insulating properties or by more than two layers of different material with insulating properties. Furthermore, the materials used are not limited to silicon dioxide (SiO2) or aluminum oxide. For example, word line layer WLL47 and a portion of vertical column 332 comprise a memory cell MC1. Word line layer WLL46 and a portion of vertical column 332 comprise a memory cell MC2. Word line layer WLL45 and a portion of vertical column 332 comprise a memory cell MC3. Word line layer WLL44 and a portion of vertical column 332 comprise a memory cell MC4. Word line layer WLL43 and a portion of vertical column 332 comprise a memory cell MC5. In other architectures, a memory cell can have a different structure, however, the memory cell would still be the storage unit.

When a memory cell is programmed, electrons are stored in a portion of the charge-trapping layer 373 that is associated with the memory cell. These electrons are drawn into the charge-trapping layer 373 from the channel 371, through the tunneling dielectric 372, in response to an appropriate voltage on the word line region 376. The threshold voltage (Vt) of a memory cell is increased in proportion to the amount of stored charge. In one embodiment, the programming is achieved through Fowler-Nordheim tunneling of the electrons into the charge-trapping layer 373. During an erase operation, the electrons return to the channel 371 or holes are injected into the charge-trapping layer 373 to recombine with electrons. In one embodiment, erasing is achieved using hole injection into the charge-trapping layer 373 via a physical mechanism such as gate induced drain leakage (GIDL).

Storage cells in the same location or position in different memory structures 329 (e.g., different memory strings 329) on different bit lines, in certain embodiments, can be on the same word line. Each word line can store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D memory structure 329 comprises an "I" shaped memory structure 329. In other embodiments, a vertical, 3D memory structure 329 can comprise a "U" shaped structure or can have another vertical and/or stacked architecture. Such U-shaped architecture can have different SGD switches at the top of the legs of the U and a common SGS switch at the base of the U. In certain embodiments, four sets of strings 329 (e.g., four sets of 48 word lines, or another predefined number of word lines) can form an erase block, while in other embodiments, fewer or more than four sets of strings 329 can form an erase block. As can be appreciated, any suitable number of storage cells can be part of a single string 329. In one embodiment, a single string 329 includes forty-eight storage cells.

Figure 4:
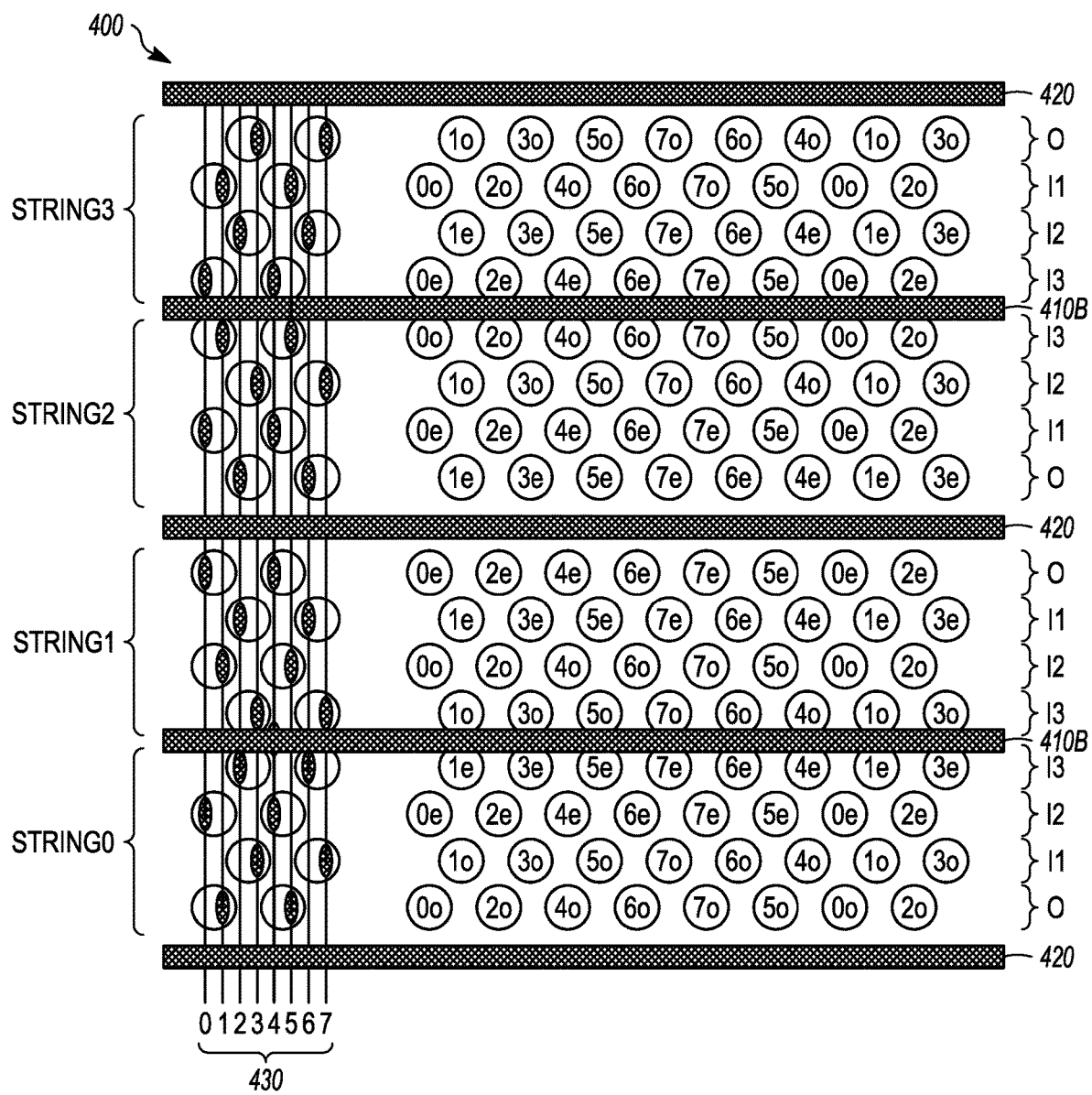
FIG. 4 is a diagram showing a top view of a 3D memory block according to an example embodiment.

FIG. 4 is a schematic diagram illustrating a schematic top view of a 3D memory block 400, according to one embodiment. As illustrated, the 3D memory block 400 can comprise a series of memory holes or cells (represented by circles labeled "0o" to "7o" and "0e" to "7e" in FIG. 4). Each of these memory holes can be organized into strings (labeled as "String0" to "String3" in FIG. 4) and/or further organized into IO groups (labeled as "O," "I1," "I2," and "I3" in FIG. 4). Each IO group is located between two different types of etching features formed in the 3D memory block 400, a shallow etching feature 410 (e.g., called SHE), and a deep etching feature 420 (e.g., called ST). The shallow etching feature 410 is over the memory holes and creates partial SGD structures at the top of the vertical memory strings schematically shown in 400. The IO groups adjacent to a deep etching feature 420 are labeled Outer IO groups (O); the IO groups adjacent to a shallow etching feature 410 are labeled Inner3 IO groups (I3); the IO groups adjacent to the Outer IO groups are labeled Inner1 IO groups (I1); and the IO groups adjacent to the Inner3 IO groups (I3) are labeled Inner2 IO groups (I2). It should be noted that the procedures and methods disclosed herein can be implemented in connection with a wide variety of types of memory, such as NAND or NOR memory, 2D memory, 3D memory, or memory employing a charge-based or resistive-based storage technology. In one example, the illustrated memory block 400 can comprise 16K memory cells, which can be further segregated into smaller groups of memory cells comprising 1K memory cells each. These smaller groups can be arranged in tiers. The tiers can include the memory cells associated with the holes designated by the same designated circles in FIG. 4. The memory cells labeled as 2*o* are part of a same tier. The memory cells labeled 3*e* are part another tier. The memory cells labeled as 2*e* are part of a same tier. The memory cells labeled 3*o* are part another tier. As explained herein the controller can select a single tier for a program verify operation when the program verify level is unlikely to find an overprogrammed state or when the single tier is representative of the other tiers. At least one intermediate level for program verify is a multiple tier verify operation.

Some manufacturing processes for 3D memory can include film deposition processes that tend to dominate over etching processes performed during manufacturing. For these types of manufacturing processes, the outer memory holes in the Outer IO groups (O) will generally program slower than the inner memory hole (I3). However, other manufacturing processes for 3D memory can include etching processes that tend to dominate over film deposition processes during manufacturing. For these types of manufacturing processes, the inner memory hole (I3) will generally program slower than the outer memory holes (O). It should be noted, however, that the physical position of an IO group of memory cells within the 3D memory structure is not always dispositive of its relative programming speed due to this variation introduced during the manufacturing process or as a result of wear induced by usage of the device. Moreover, cycling degradation can also cause the relative programming speed of different memory cells, or groups of memory cells, to shift over time.

Continuing with FIG. 4, each of the memory holes (0*o*-7*o* and 0*e*-7*e*) can be connected to bit lines 430 (labeled as bit lines 0-7 in FIG. 4). The bit lines 430 extend above the memory holes and are connected to select memory holes via connection points (illustrated as small, solid ovals in FIG. 4) indicating where a bit line 430 connects to a memory hole. For ease of illustration, only eight bit lines 430 (0 to 7) are shown in FIG. 4. However, it will be understood that other bit lines (not shown) also extend above the other memory holes in FIG. 4. The memory holes in the string are also connected at one end to an SGD switch and at the other end with a SGS switch. The SGD switch is a partial structure, e.g., a semi-circle structure due to the SHE trench 410 being etched into a side of the SGD switch.

Figure 5A:
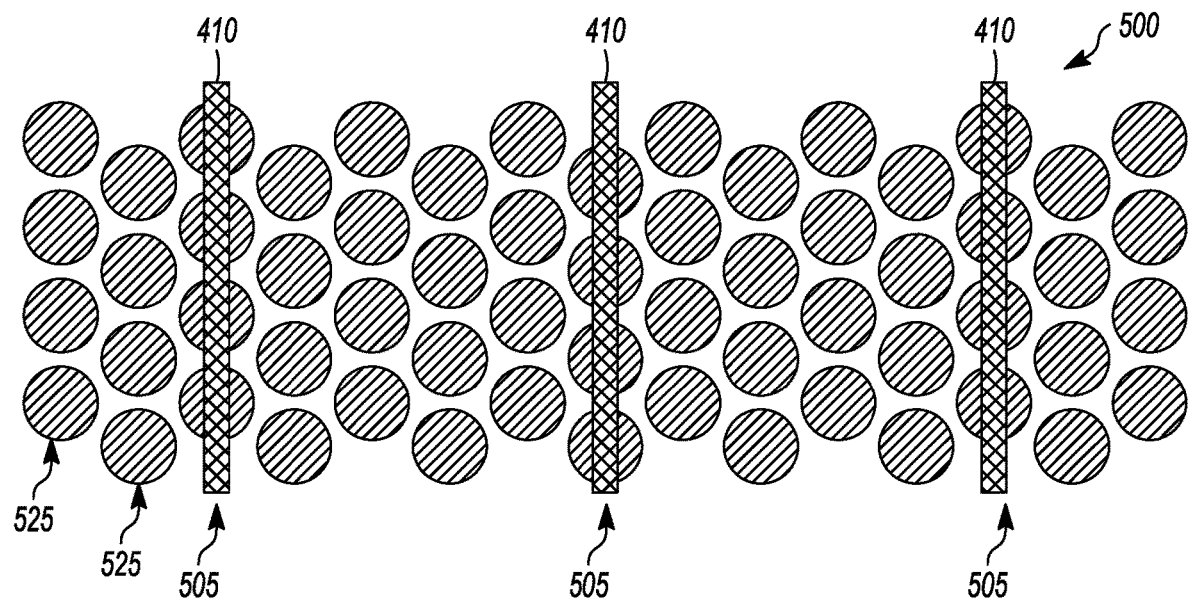
FIG. 5A illustrates a conventional separation cut along aligned memory holes.

FIG. 5A shows a schematic plan view of a memory array 500 with a plurality of memory holes 522, which can be the vertical memory cell strands described herein, and a plurality of dummy holes 505, which need not be complete memory structures. The dummy holes 505 have a shallow trench etch 410 extending through the group of aligned dummy holes 505. The dummy holes 505 do not store data or have functional memory cells in an example.

Figure 5B:
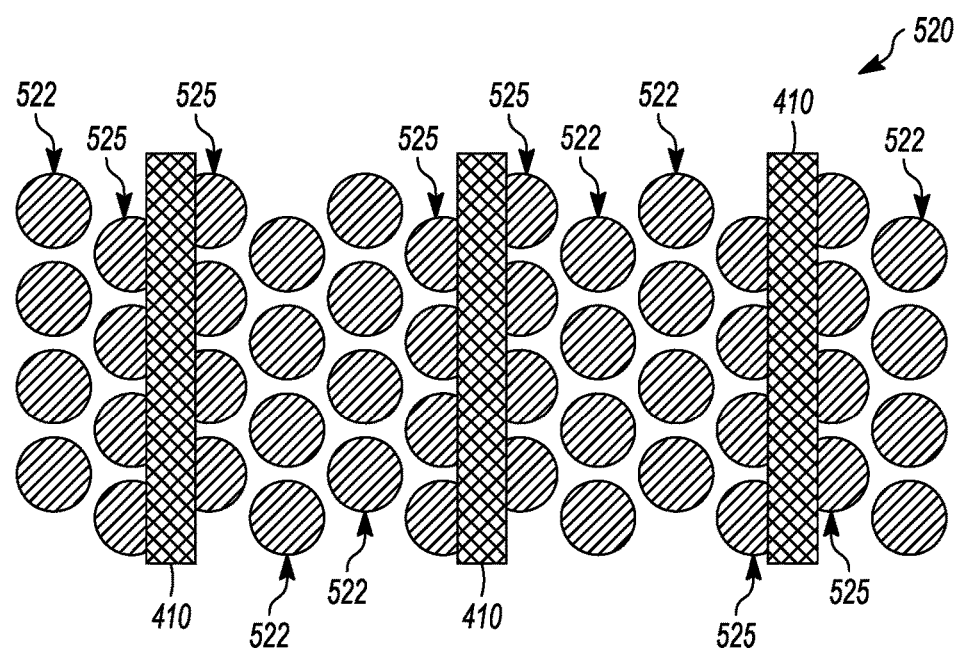
FIG. 5B illustrates a separation cut along two aligned groups of memory holes.

FIG. 5B shows a schematic plan view of a memory array 500 with a plurality of memory holes 522, which can be the vertical memory cell strands described herein. Unlike the memory structure 500, there are no dummy holes 505. A shallow etch dummy cut (e.g., a SHE trench 410) is made in a gap between two adjacent rows of memory cells 525 and overlapping both memory cell rows 525 creating a working strand that has a trench etched down into a side of at least the SGD switch at the top of the working memory strand, here shown as holes 525. While using the shallow trench improves yield and memory cell density, it may introduce program disturb when the memory cell strands 522 adjacent the strands 525 with the partial SGD switches. One approach to address the program disturb can be to increase SHE 410 width to reduce coupling between neighbor strings. However, this is not a scalable approach. In future, if SHE width needs to be reduced to gain die size, Y-mode program disturb (program disturb caused by selecting one string and unselecting the other strings) will become an issue. Examples described herein may address the program disturb, e.g., at the high voltage program states, by the controller circuitry controlling the bias voltages at the worldlines being programmed and the bias voltage applied to the partial SGD switches part of the memory strands 525.

Figure 6:
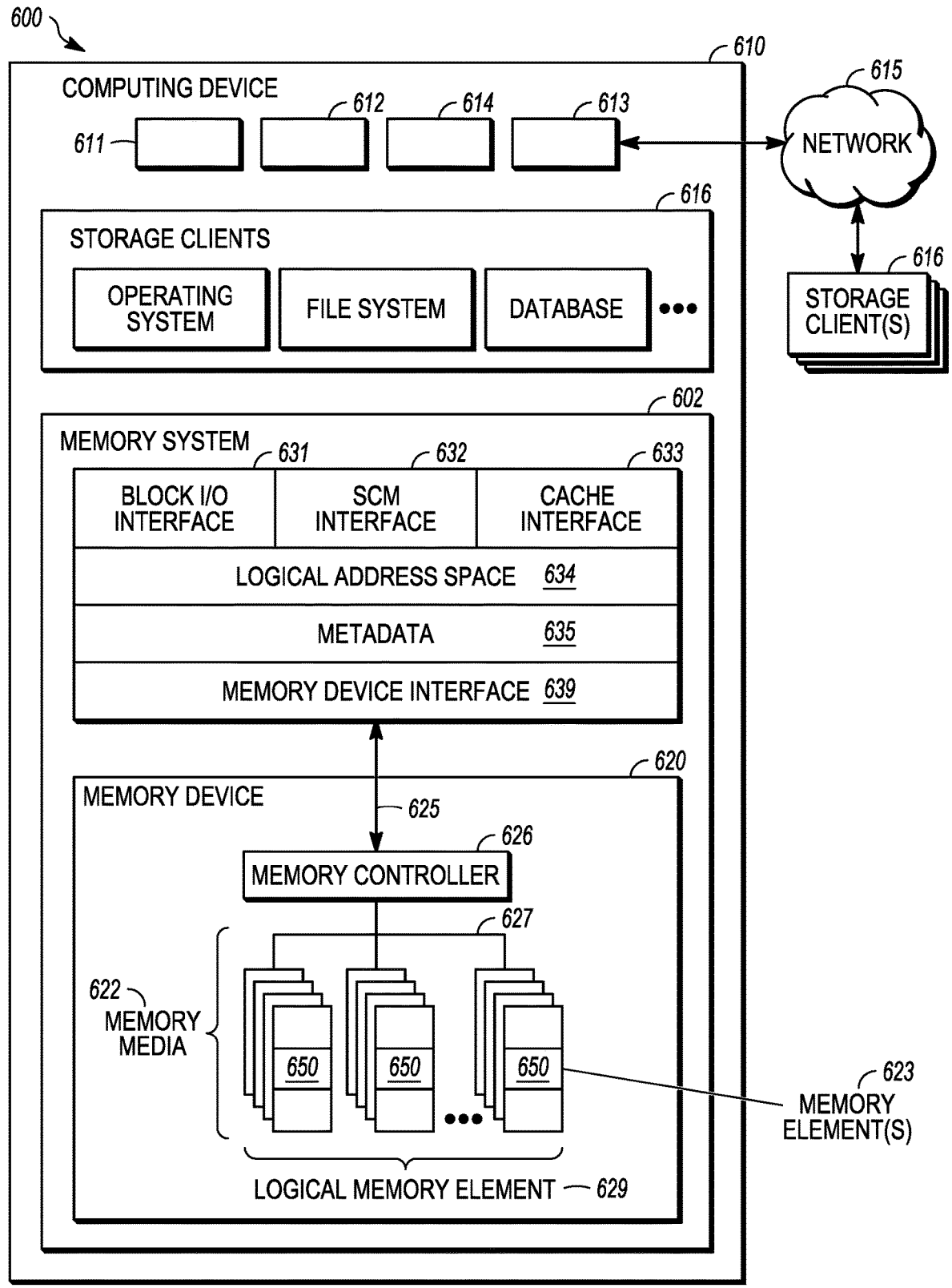
FIG. 6 is a schematic block diagram illustrating an embodiment of a memory system according to an example embodiment.

FIG. 6 is a schematic block diagram illustrating an embodiment of a system 600 and computing device 610 for memory cell subgroup identification and selection. The computing device 610 comprises one or more identification circuits or tier selection circuits 650 for memory media 622 of a non-volatile and/or volatile memory device 620. As used herein, a "tier circuit" refers to a circuit utilized to identify a particular tier of memory cells (e.g., a 2*o* tier) in relation to at least one other subgroup or tier of memory cells and select the identified tier of memory cells for use in at least one programming operation, e.g., program verify. The tier selection circuits 650 can operate to select a single tier for some program verify levels and multiple tiers for other program verify levels in a same verify operation. At least one verify is a single tier verify, e.g., the A or first program verify level. The first program verify level can be the lowest voltage. In an example embodiment, the last program verify level is also a single tier verify operation. In an example embodiment, at least one intermediate program verify is performed on multiple tiers.

A tier selection circuit 650 can be part of a non-volatile and/or volatile memory element 623 (e.g., disposed on a same integrated circuit device as a non-volatile memory media 622). In some embodiments, a memory device 620 can at least partially operate on and/or in communication with a nonvolatile and/or volatile memory system 602 of a computing device 610, which can comprise a processor 611, volatile memory 612, and a communication interface 613. The processor 611 can comprise one or more central processing units, one or more general-purpose processors, one or more application-specific processors, one or more virtual processors (e.g., the computing device 610 can be a virtual machine operating within a host), one or more processor cores, or the like. The communication interface 613 can comprise one or more network interfaces configured to communicatively couple the computing device 610 and/or memory controller 626 to a communication network 615, such as an Internet Protocol (IP) network, a Storage Area Network (SAN), wireless network, wired network, or the like.

The memory device 620, in various embodiments, can be disposed in one or more different locations relative to the computing device 610. In one embodiment, the memory device 620 comprises one or more non-volatile and/or volatile memory elements 623, such as semiconductor chips or packages or other integrated circuit devices disposed on one or more printed circuit boards, storage housings, and/or other mechanical and/or electrical support structures. For example, the memory device 620 can comprise one or more direct inline memory module (DIMM) cards, one or more expansion cards and/or daughter cards, a memory card, a universal serial bus (USB) drive, a solid-state-drive (SSD) or other hard drive device, and/or can have another memory and/or storage form factor. The memory device 620 can be integrated with and/or mounted on a motherboard of the computing device 610, installed in a port and/or slot of the computing device 610, installed on a different computing device 610 and/or a dedicated storage appliance on the network 615, in communication with the computing device 610 over an external bus (e.g., an external hard drive), or the like.

The memory device 620, in one embodiment, can be disposed on a memory bus of a processor 611 (e.g., on the same memory bus as the volatile memory 612, on a different memory bus from the volatile memory 612, in place of the volatile memory 612, or the like). In a further embodiment, the memory device 620 can be disposed on a peripheral bus of the computing device 610, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the memory device 620 can be disposed on a data network 615, such as an Ethernet network, an Infiniband network, SCSI RDMA over a network 615, a storage area network (SAN), a local area network (LAN), a wide area network (WAN) such as the Internet, another wired and/or wireless network 615, or the like.

The computing device 610 can further comprise a non-transitory, computer readable storage medium 614. The computer readable storage medium 614 can comprise executable instructions configured to cause the computing device 610 (e.g., processor 611) to perform steps of one or more of the methods disclosed herein. The processor 611 can include circuitry to bias the partial SGD switch to reduce the program disturb in an example embodiment. In one embodiment, a processor 611 can comprise hardware of a non-volatile and/or volatile memory element 623, computer executable program code of a device driver, firmware of a memory controller 626 and/or a memory media controller for a memory element 623, another electrical component, or the like. In one embodiment, a processor 611 is integrated on a memory element 623 (e.g., an on-die subgroup selection circuit 650 and/or other integrated hardware).

According to various embodiments, a memory controller 626 can manage one or more memory devices 620 and/or memory elements 623, one or more of which can comprise an on-die subgroup selection circuit 650. The memory device(s) 620 can comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 620). Memory units and/or regions can include, but are not limited to pages, memory divisions, blocks, sectors, collections or sets of physical storage locations (e.g., logical pages, logical blocks), or the like.

A device driver and/or the memory controller 626, in certain embodiments, can present a logical address space 634 to the storage clients 616. As used herein, a logical address space 634 refers to a logical representation of memory resources. The logical address space 634 can comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an I node, a Universally Unique Identifier (UUID), a Globally Unique Identifier (GUID), a hash code, a signature, an index entry, a range, an extent, or the like.

A device driver for the memory device 620 can maintain metadata 635, such as a logical to physical address mapping structure to map logical addresses of the logical address space 634 to media storage locations on the memory device(s) 620. A device driver can be configured to provide storage services to one or more storage clients 616. The storage clients 616 can include local storage clients 616 operating on the computing device 610 and/or remote storage clients 616 accessible via the network 615 and/or network interface 613. The storage clients 616 can include, but are not limited to: operating systems, file systems, database applications, server applications, kernel-level processes, user-level processes, applications, and the like.

A device driver can be communicatively coupled to one or more memory devices 620. The one or more memory devices 620 can include different types of memory devices including, but not limited to: solid-state storage devices, semiconductor storage devices, SAN storage resources, volatile memory devices, non-volatile memory devices, or the like. The one or more memory devices 620 can comprise one or more respective memory media controllers 626 and memory media 622. A device driver can provide access to the one or more memory devices 620 via a traditional block I/O interface 631. Additionally, a device driver can provide access to enhanced functionality through the SCM interface 632. The metadata 635 can be used to manage and/or track data operations performed through any of the Block I/O interface 631, SCM interface 632, cache interface 633, or other related interfaces.

The cache interface 633 can expose cache-specific features accessible via a device driver for the memory device 620. Also, in some embodiments, the SCM interface 632 presented to the storage clients 616 provides access to data transformations implemented by the one or more memory devices 620 and/or the one or more memory media controllers 626.

A device driver can present a logical address space 634 to the storage clients 616 through one or more interfaces. As discussed above, the logical address space 634 can comprise a plurality of logical addresses, each corresponding to respective media locations on one or more memory devices 620. A device driver can maintain metadata 635 comprising any-to-any mappings between logical addresses and media locations, or the like.

A device driver can further comprise and/or be in communication with a memory device interface 639 configured to transfer data, commands, and/or queries to the one or more memory devices 620 over a bus 625, which can include, but is not limited to: a memory bus of a processor 611, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 615, Infiniband, SCSI RDMA, or the like. The memory device interface 639 can communicate with the one or more memory devices 620 using input-output control (IO-CTL) command(s), IO-CTL command extension(s), remote direct memory access, or the like.

The communication interface 613 can comprise one or more network interfaces configured to communicatively couple the computing device 610 and/or the memory controller 626 to a network 615 and/or to one or more remote, network-accessible storage clients 616. The storage clients 616 can include local storage clients 616 operating on the computing device 610 and/or remote storage clients 616 accessible via the network 615 and/or the network interface 613. The memory controller 626 is part of and/or in communication with one or more memory devices 620. Although FIG. 6 depicts a single memory device 620, the disclosure is not limited in this regard and could be adapted to incorporate any number of memory devices 620, a combination of one or more volatile memory devices 620 and one or more non-volatile memory devices 620, or the like.

The memory device 620 can comprise one or more elements 623 of memory media 622. In one embodiment, an element 623 of memory media 622 comprises a volatile memory medium 622, such as random-access memory (RAM), dynamic RAM (DRAM), synchronous DRAM (SDRAM), double data rate (DDR) SDRAM, static RAM (SRAM), thyristor RAM (T-RAM), zero-capacitor RAM (Z-RAM), or the like. In certain embodiments, an element 623 of memory media 622 comprises a non-volatile memory medium 622, such as ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS) memory, programmable metallization cell (PMC) memory, conductive-bridging RAM (CBRAM), magneto-resistive RAM (MRAM), magnetic storage media (e.g., hard disk, tape), optical storage media, or the like. Thus, the memory device 620 may rely, for example, on stored voltage levels or stored resistance levels. The one or more elements 623 of memory media 622, in certain embodiments, comprise storage class memory (SCM).

While legacy technologies such as NAND flash can be block and/or page addressable, storage class memory, in one embodiment, is byte addressable. In further embodiments, storage class memory can be faster and/or have a longer life (e.g., endurance) than NAND flash; can have a lower cost, use less power, and/or have a higher storage density than DRAM; or offer one or more other benefits or improvements when compared to other technologies. For example, storage class memory can comprise one or more non-volatile memory elements 623 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 622 is referred to herein as "memory media," in various embodiments, the non-volatile memory media 622 can more generally comprise one or more non-volatile recording media capable of recording data, which can be referred to as a non-volatile memory medium, a non-volatile storage medium, or the like. Further, the nonvolatile memory device 620, in various embodiments, can comprise a non-volatile recording device, a non-volatile memory device, a non-volatile storage device, or the like. Similarly, a nonvolatile memory element 623, in various embodiments, can comprise a non-volatile recording element, a non-volatile memory element, a non-volatile storage element, or the like.

The non-volatile memory media 622 can comprise one or more non-volatile memory elements 623, which can include, but are not limited to: chips, packages, planes, die, or the like. A non-volatile memory controller 626 can be configured to manage data operations on the nonvolatile memory media 622, and can comprise one or more processors, programmable processors (e.g., FPGAs), ASICs, microcontrollers, or the like. In some embodiments, the nonvolatile memory controller 626 is configured to store data on and/or read data from the nonvolatile memory media 622, to transfer data to/from the non-volatile memory device 620, and so on.

The non-volatile memory controller 626 can be communicatively coupled to the non-volatile memory media 622 by way of a bus 627. The bus 627 can comprise an I/O bus for communicating data to/from the non-volatile memory elements 623. The bus 627 can further comprise a control bus for communicating addressing, and other command and control information to the non-volatile memory elements 623. In some embodiments, the bus 627 can communicatively couple the non-volatile memory elements 623 to the non-volatile memory controller 626 in parallel. This parallel access can allow the non-volatile memory elements 623 to be managed as a group, forming a logical memory element 629. The logical memory element can be partitioned into respective logical memory units (e.g., logical pages) and/or logical memory divisions (e.g., logical blocks). The logical memory units can be formed by logically combining physical memory units of each of the non-volatile memory elements.

The non-volatile memory controller 626 can comprise and/or be in communication with a device driver executing on the computing device 610. A device driver can provide storage services to the storage clients 616 via one or more interfaces 631, 632, and/or 633. In some embodiments, a device driver provides a block-device I/O interface 631 through which storage clients 616 perform block-level I/O operations. Alternatively, or in addition, a device driver can provide a storage class memory (SCM) interface 632, which can provide other storage services to the storage clients 616. In some embodiments, the SCM interface 632 can comprise extensions to the block device interface 631 (e.g., storage clients 616 can access the SCM interface 632 through extensions or additions to the block device interface 631). Alternatively, or in addition, the SCM interface 632 can be provided as a separate API, service, and/or library. A device driver can be further configured to provide a cache interface 633 for caching data using the non-volatile memory system 602. A device driver can further comprise a non-volatile memory device interface 639 that is configured to transfer data, commands, and/or queries to the non-volatile memory controller 626 over a bus 625, as described above.

Figure 7:
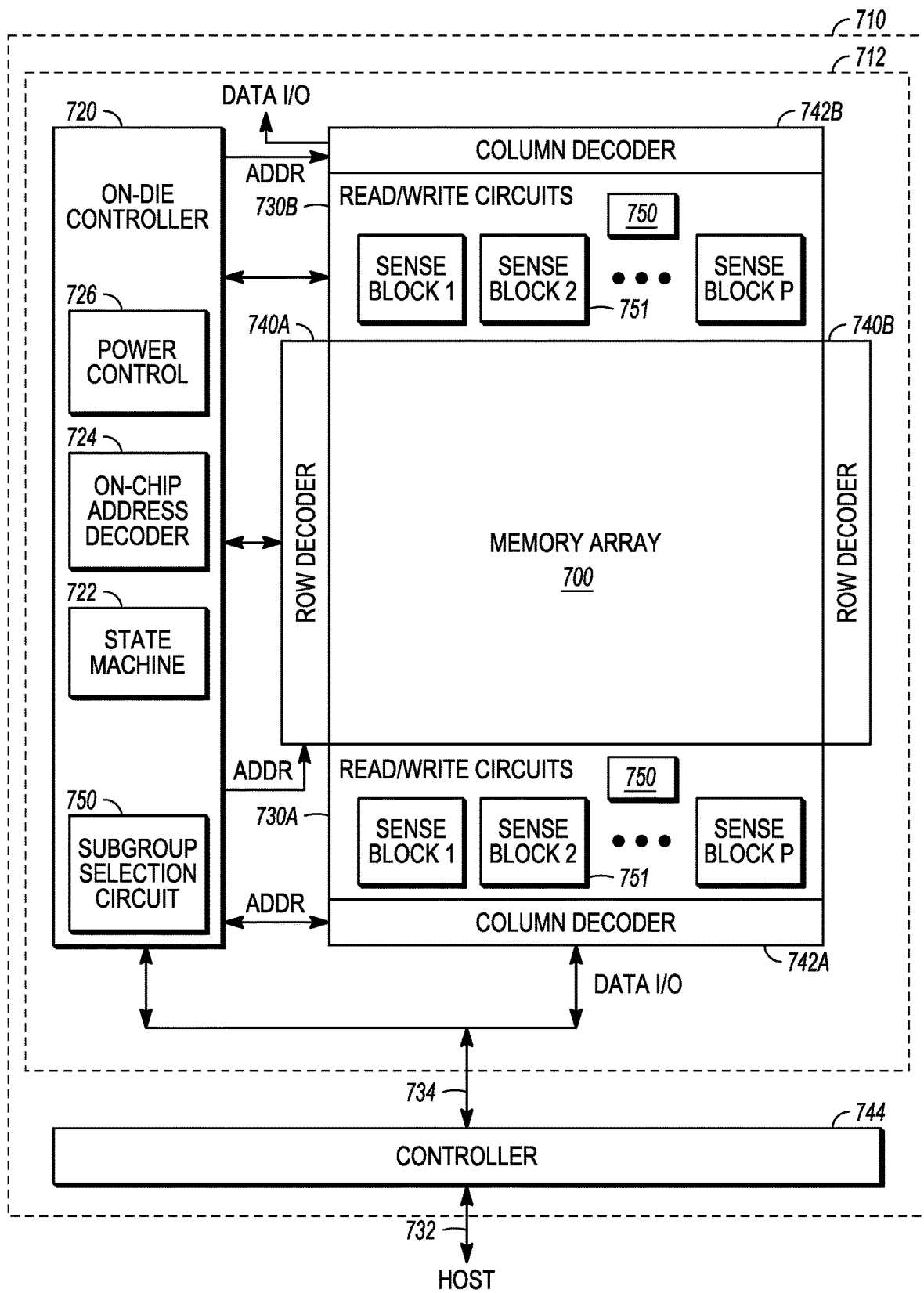
FIG. 7 is a schematic block diagram of non-volatile storage device for memory cell subgroup identification and selection.

FIG. 7 is a schematic block diagram illustrating an embodiment of a non-volatile storage device 710, which can perform programming and verify operations as described herein. The non-volatile storage device 710 can include one or more memory die or chips 712. "memory die" comprises a block of semiconducting material on which a memory circuit is fabricated and, as used herein, also includes the memory circuit disposed thereon. The nonvolatile storage device 710 can be substantially similar to the computing device 610 described with reference to FIG. 6.

The memory die 712, in some embodiments, includes an array 700 (e.g., two-dimensional or three dimensional) of memory cells, an on-die controller 720, and read/write circuits 730A/730B. In one embodiment, access to the memory array 700 by the various peripheral circuits is implemented in a symmetric fashion, on opposite sides of the memory array 700, so that the densities of access lines and circuitry on each side are reduced by half. The read/write circuits 730A/730B, in a further embodiment, include multiple sense blocks 751 which allow a page of memory cells to be read or programmed in parallel.

The memory array 700, in various embodiments, is addressable by word lines via row decoder circuits 740A/740B and by bit lines via column decoder circuits 742A/742B. In some embodiments, a controller 744 is included in the same memory device 710 (e.g., a removable storage card or package) as the one or more memory die 712. Commands and data are transferred between the host and controller 744 via lines 732 and between the controller and the one or more memory die 712 via lines 734. One implementation can include multiple chips 712.

On-die controller 720, in one embodiment, cooperates with the read/write circuits 730A/730B to perform memory operations on the memory array 700. The on-die controller 720, in certain embodiments, includes a state machine 722, an on-chip address decoder 724, a power control circuit 726, and a subgroup select circuit 750. In one embodiment, the on-chip address decoder 724 and/or the power control circuit 726 can be part of and/or controlled by the controller 744. The on-die controller 720 an operate to select certain single tiers for certain program verify levels and multiple tiers for other program verify levels.

The state machine 722, in one embodiment, provides chip-level control of memory operations. The on-chip address decoder 724 provides an address interface to convert between the address that is used by the host or a memory controller to the hardware address used by the decoder circuits 740A, 740B, 742A, 742B. The power control circuit 726 controls the power and voltages supplied to the SGS switch, the SGD switch the word lines, and the bit lines during memory operations. In one embodiment, the power control circuit 726 includes one or more charge pumps that can create voltages larger than the supply voltage. The state machine 722 can be used to count the bitscans and compare the result to the threshold value, which can be stored in the state machine 722. The state machine 722 can also trigger the program verify operation to skip to the next memory level verify operation when the bitscan count exceeds the threshold value.

In an embodiment, one or any combination of the on-die controller 720, state machine 722, power control circuit 726, on-chip address decoder 724, decoder circuit 742 A, decoder circuit 742B, decoder circuit 740 A, decoder circuit 740B, read/write circuits 730 A, read/write circuits 730B, and/or controller 744 can be referred to as one or more managing circuits or generally as a controller circuitry.

Figure 8:
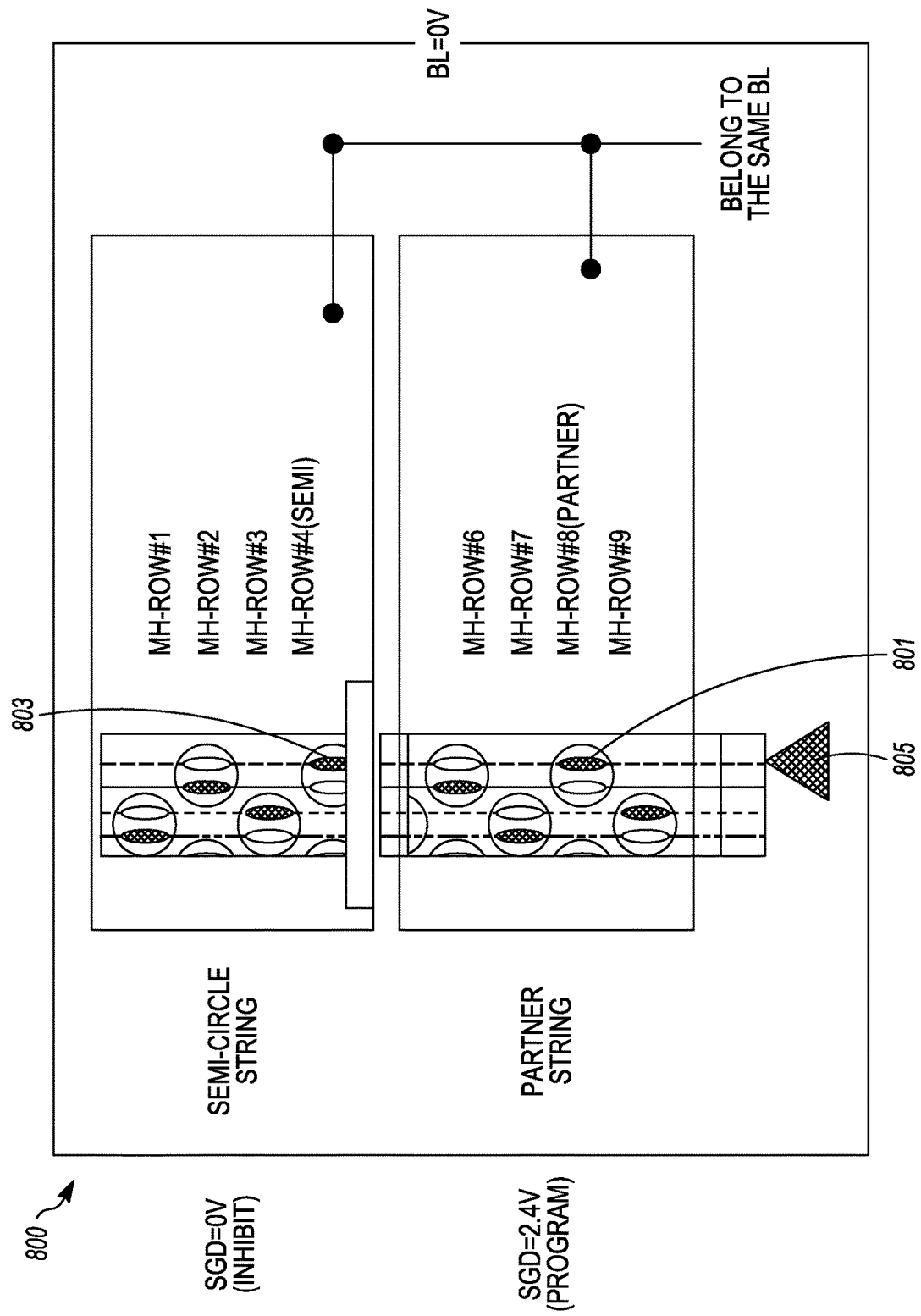
FIG. 8 illustrates a schematic view of memory strings according to an example embodiment.

FIG. 8 illustrates a schematic view 800 of a programming operation on a single string 801 and possible program disturb on a neighboring string 803. The selected string has its SGD biased with 2.4 volts to program the memory cells. The unselected strings have their SGD held at zero volts. The memory strings in rows 1-4 have partial SGDs. The memory strings in rows 6-9 have full SGDs. The memory strings in rows 4 and 7 are connected to the same bitline. The bias voltages at the partial SGDs and the bit lines are controlled at the higher program voltage to both be at a reduced voltage level relative to other program bias voltages to reduce program disturb.

Figure 9:
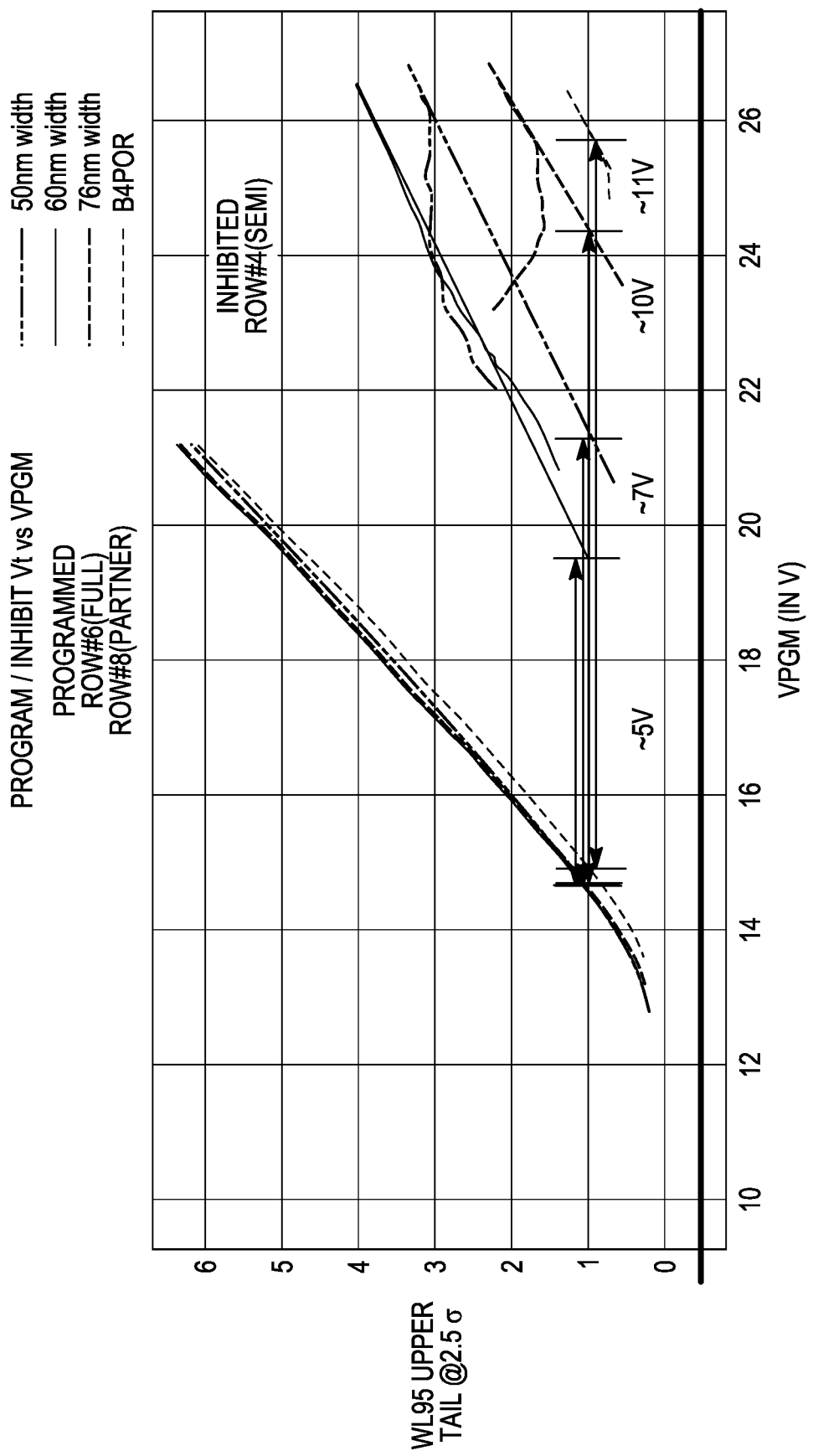
FIG. 9 illustrates a graph of program/inhibit threshold voltage as a function of programming voltage according to an example embodiment.

The proposed SGD structure, with partial SGD and full SGD, is expected to provide cost-reduction due to dummy memory hole removal but may result in several device challenges. One such challenge is worse Y-mode PD for partial SGD. As shown in FIG. 9, Y-mode program disturb is on unselected string whose SGD=0V and BLs=0V while programming selected string whose SGD=VSGD=2.4V and BLs=0V. The Y-mode program disturb is worse on partial SGD splits versus the conventional dummy memory hole shallow trench etch at multiple trench widths (the shallow trench etches, e.g., a SHE, width splits=50 nm, 60 nm, or 76 nm). From measured data, channel boost potential is reduced from ~11V on conventional (i.e., no SC SGD) to ~5V on partial SGD split. This can result in a reliability risk and can be a concern to make partial SGD for future memory arrays (e.g., BiCOS) for scaling and cost reduction purposes.

Figure 10:
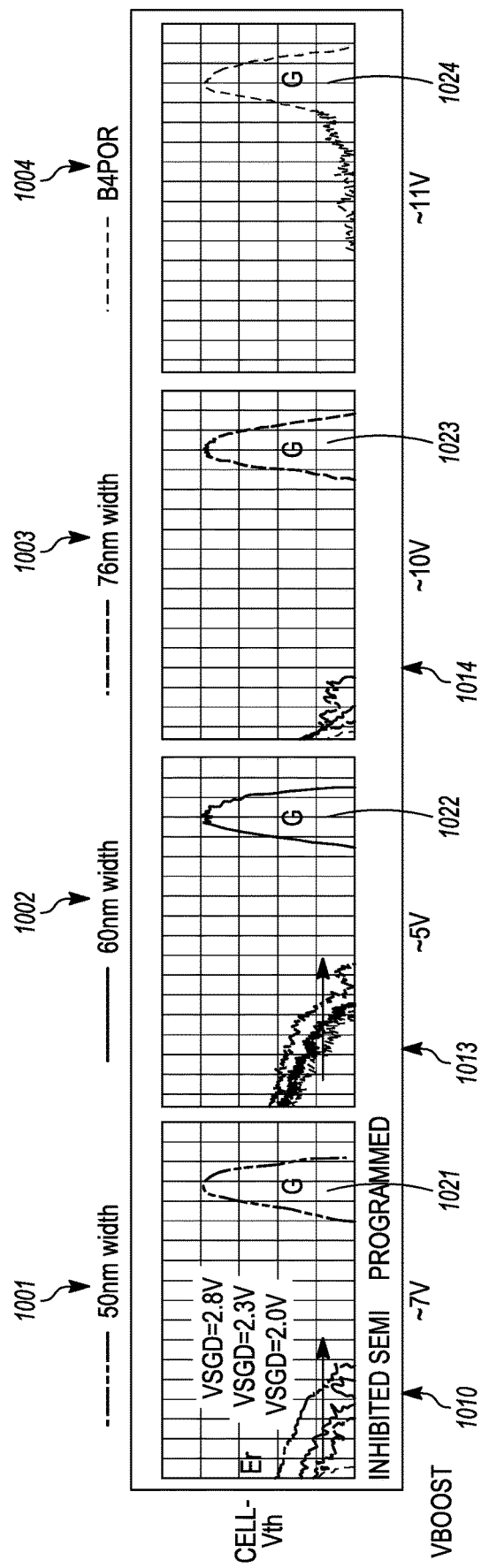
FIG. 10 illustrates a memory cell voltage as a function of select gate drain voltage according to an example embodiment.

FIG. 10 shows graphs 1001-1004 of bit count as a function of cell voltage. The Y-mode program disturb on the partial SGD (e.g., semi-circle SGD) is a function of the bias voltage (VSGD) applied to the SGD. With reference to the structure shown in FIG. 8, the graphs 1001-1004 correspond to the partial SGD widths and the conventional dummy memory hole trench. The Y-mode program disturb is shown as a function of VSGD is checked by programming ALLG on string 1 (right most peak, 1021, 1022, 1023, 1024 in graphs 1001-1004, respectively) and program disturb is checked on string 0 which has a partial SGD. The program disturb can be seen at 1010 in graph 1001, at 1013 in graph 1002 and 1014 in graph 1003. There is little program disturb in the conventional memory hole trench as shown in graph 1004. Clearly, reducing VSGD from 2.8V to 2.3V to 2.0V reduces Y-mode program disturb on the memory string of the partial SGD. This is a result of the partial SGD having an uncovered channel portion (e.g., an ungated portion), which can couple to neighbor strings SGD bias during programming which is at VSGD. Due to this, higher VSGD means the ungated portion of the partial SGD has effectively higher gate bias and causes boost leak and hence worse Y-mode program disturb.

Y-mode program disturb increases with increasing the programming voltage (VPGM). Here Y-mode program disturb is checked by programming ALLG, ALLF and ALLC on neighbor string 1. Clearly, Y-mode PD on string 0 with SC SGD is worse with ALLG and reduces with reduced state programming. This means Y-mode PD is better when lower states are programming. Data suggests we need to reduce VSGD only when programming higher states.

Figure 11:
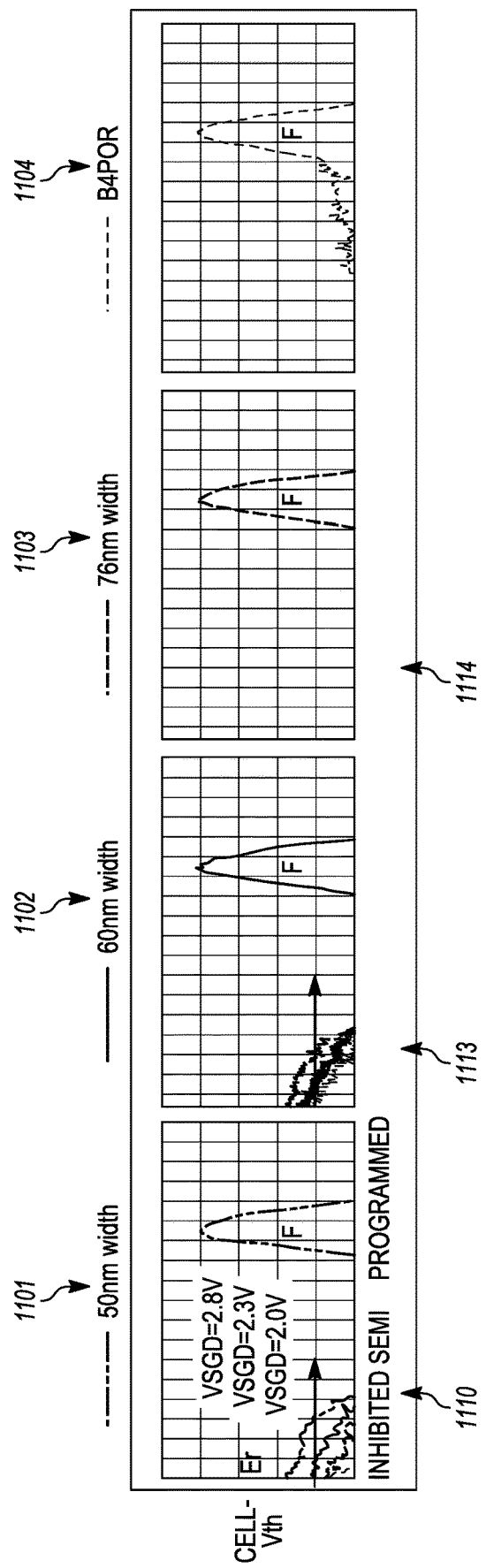
FIG. 11 illustrates a memory cell voltage as a function of select gate drain voltage according to an example embodiment.

FIG. 11 shows that a similar result is found when programming another high voltage data state (the F data state) as discussed above for the highest state (the G data state) with reference to FIG. 10. Similar components are designated with same reference number with the most significant digits changed to "11" (FIG. 11) from "10" (FIG. 10).

Figure 12:
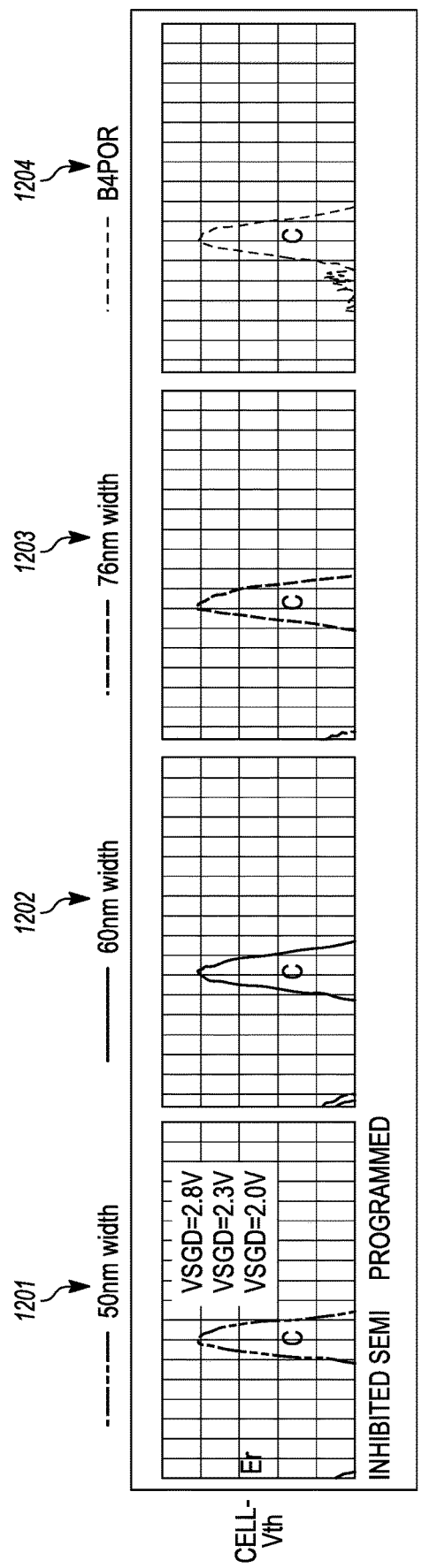
FIG. 12 illustrates a memory cell voltage as a function of select gate drain voltage according to an example embodiment.

FIG. 12 shows that the results when programming ALLC, the C data state on the selected memory string. As shown in the graphs 1201-1204 there is less, or no significant program disturb on the string with the partial SGD (graphs 1201-1203). Similar components are designated with same reference number with the most significant digits changed to "12" (FIG. 11) from "10" (FIG. 10).

Figure 13:
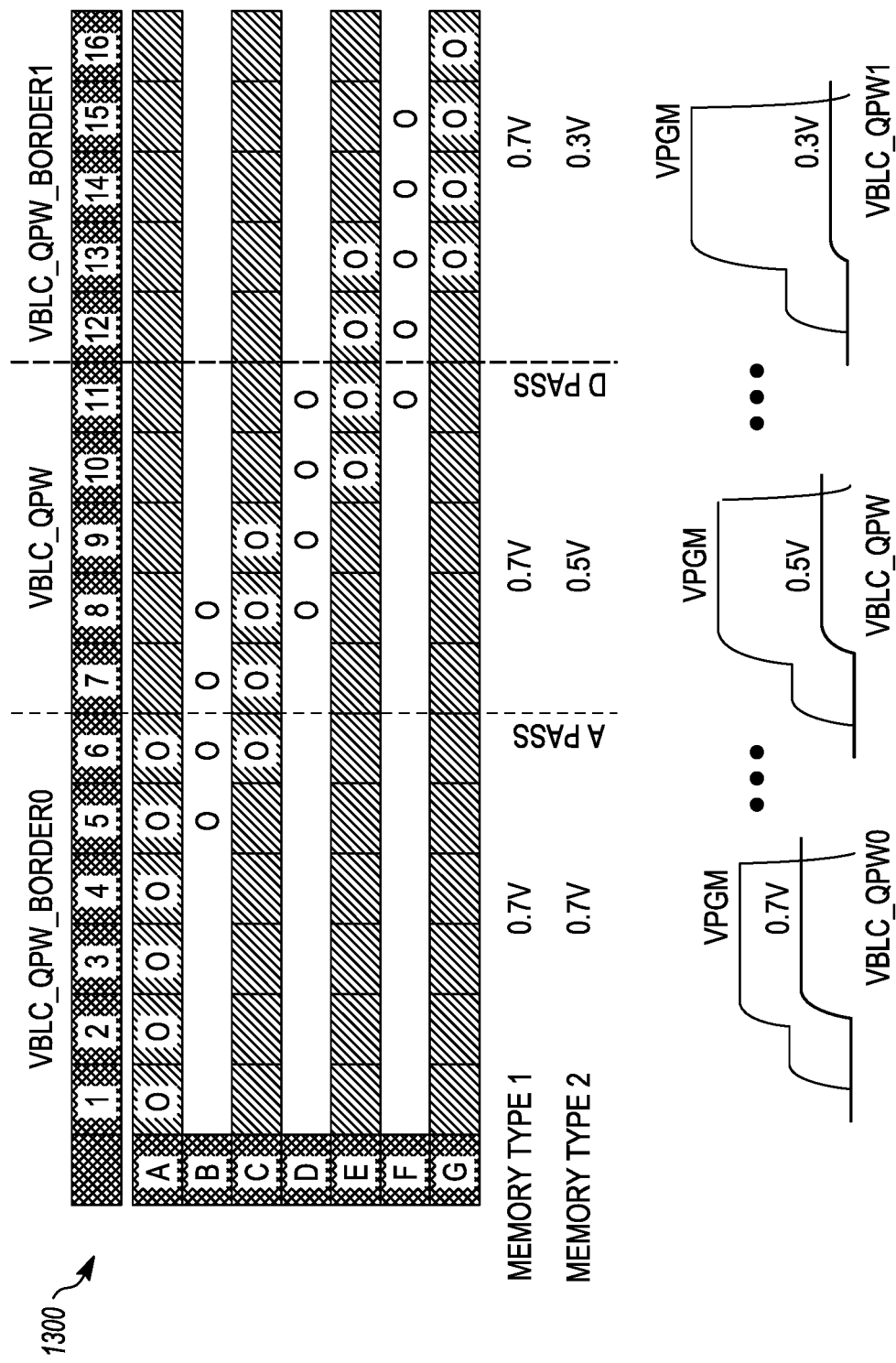
FIG. 13 illustrates a graph of programming states according to an example embodiment.

FIG. 13 shows a graph 1300 for programming all states of a TLC memory device that is part of the memory structure described herein. Reducing VSGD has limited implementation by bit line voltage for quick pass write (VBLC_QPW) applied on programming bit lines (BLs) on the selected string (selected SGD). Some memory structures (memory type 2) include a device mode where VBLC_QPW is reduced for programming higher with higher loops since higher states get the most quick pass write (QPW) benefit even with lower VBLC_QPW. As shown in graph, VBLC_QPW can be reduced from 0.7V on the A data state to 0.3V for the F data state or the G data state (2). In a TLC example, the G state is a distinct state highest memory cell storage state.

Figure 14:
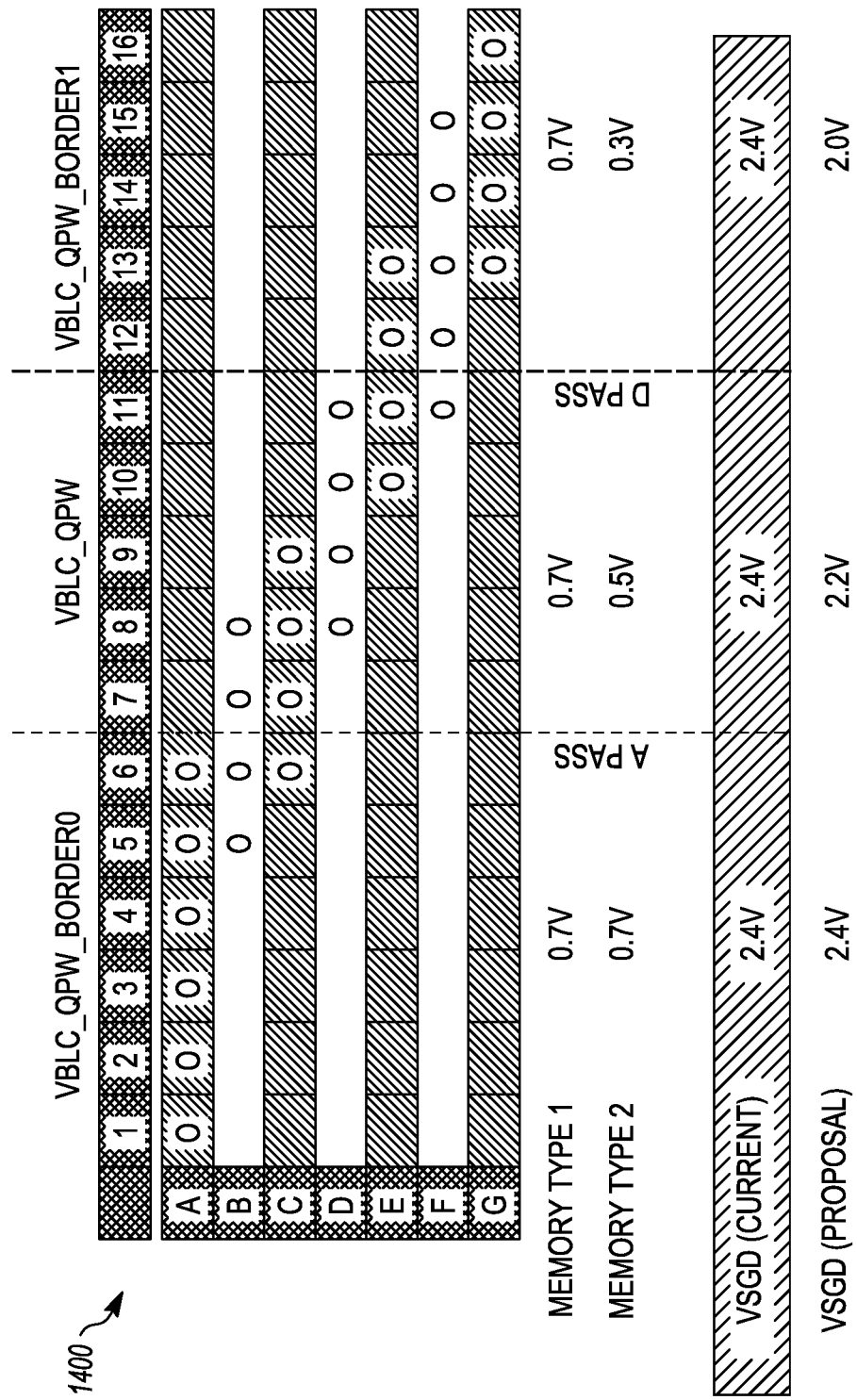
FIG. 14 illustrates a graph of programming states according to an example embodiment.

FIG. 14 shows a graph 1400 of an application and a method to reduce the Y-mode program disturb on a partial SGD. The method operates to reduce the SGD bias voltage (VSGD) when programming higher states (e.g., the G data state or the F and G data states). The method can maintain similar a VSGD window as the current methodology when combined with the existing device option of reducing VBLC_QPW for higher states. As an example, with reference to graph 1400, the VSGD is reduced by the same voltage as the bit lines. For example, when the voltage for quick pass write is reduced on the bit lines, the voltage biasing the SGD switch is reduced by a same or similar amount. The similar amount can be a partial voltage reduction that reduces program disturb by reducing the voltage biasing the SGD. The similar amount can be up to 10%, 15% or 20% more or 10%, 15% or 20% less. The similar amount reduced from the VSGD can be within 0.05 volts, 0.1 volts, 0.2 volts, 0.25 volts of the bitline voltage reduction. The similar amount of reduction for programming the higher states can be any VSGD that reduces the program disturb and still allows programming of the higher data states, e.g., the F data state and the G data state in a TLC.

Figure 15:
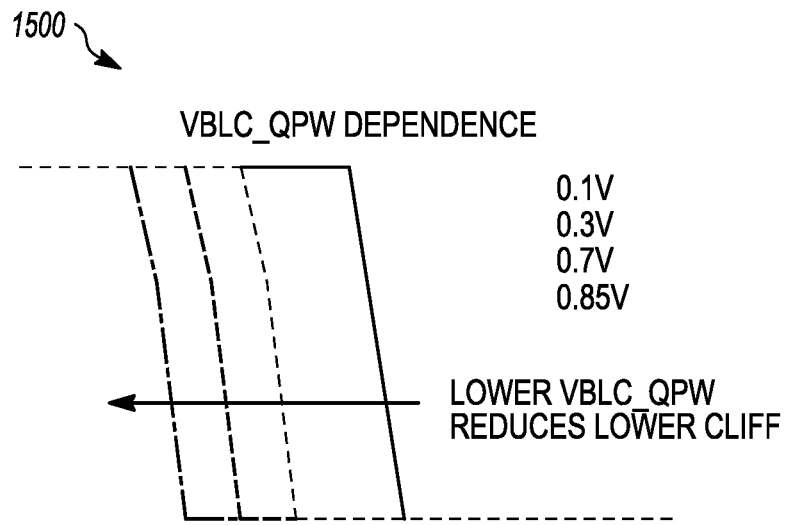
FIG. 15 illustrates a graph of programming states according to an example embodiment.

FIG. 15 is a graph 1500 showing reducing voltage for quick pass write applied to bit lines (VBLC_QPW) for programming higher states allows the reduction of the SGD voltage (VSGD) while maintaining the same VSGD margin.

Figure 16:
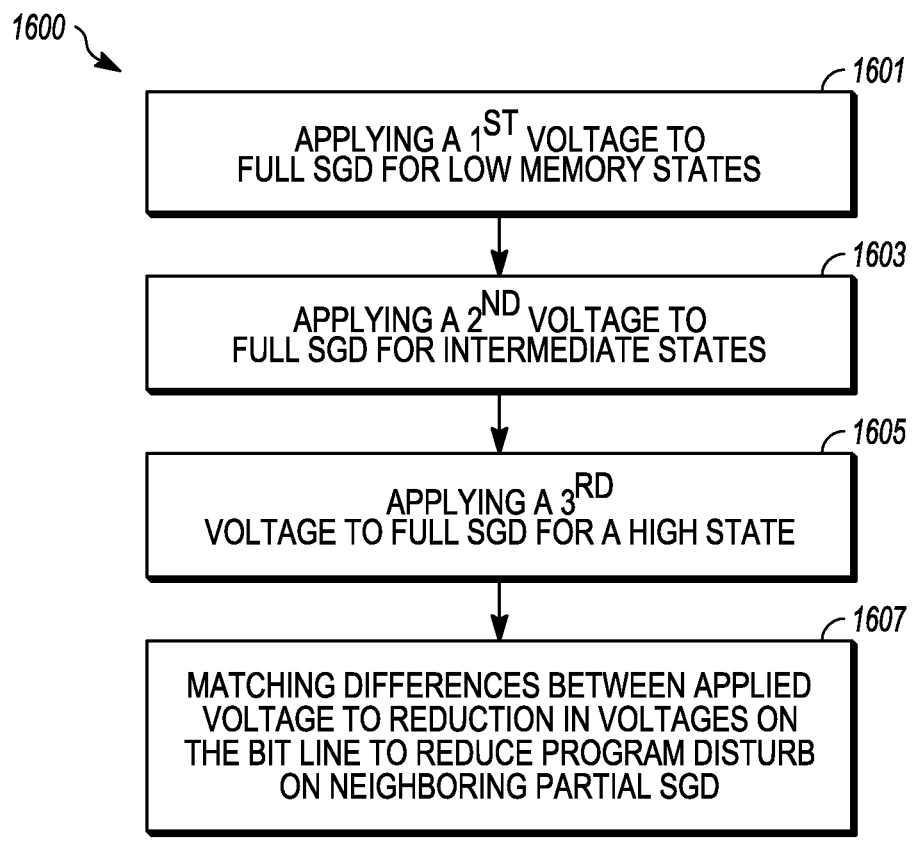
FIG. 16 illustrates a flow chart of a programming method according to an example embodiment.

FIG. 16 illustrates a method 1600 for reducing program disturb in a nonvolatile memory, e.g., a vertical string memory like BiCS.

At 1601, a first voltage is applied to a full SGD for programming low data states.

At 1603, a second voltage is applied to the full SGD for programming intermediate data states. The second voltage is less than the first voltage.

At 1605, a third voltage is applied to the full SGD for programming a high data state such as the G state or the F and G states in a QLC programming. The third voltage is less than the second voltage.

At 1607, the differences between the first, second and third voltages applied during programming match or are similar to the voltages on the bit line to reduce program disturb on unselected memory strings neighboring the memory string of the full SGD or connected to the same bit line as the memory string of the full SGD. In an example, a partial SGD is connected to the unselected memory string. The partial SGD is cut by a shallow trench and, hence, has a partially uncovered channel that is susceptible to program disturb.

Computer program code for carrying out operations for aspects of the present disclosure can be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code can execute partly or entirely on one or more of a user's computer and/or on a remote computer or server over a data network or the like. A component, as used herein, comprises a tangible, physical, non-transitory device. For example, a component can be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component can also be implemented in programmable hardware devices such as field programmable gate arrays, programmable array logic, programmable logic devices, or the like. A component can comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, can alternatively be embodied by or implemented as a component.

A circuit or circuitry, as used herein, comprises a set of one or more electrical and/or electronic components providing one or more pathways for electrical current. In certain embodiments, a circuit can include a return pathway for electrical current, so that the circuit is a closed loop. In another embodiment, however, a set of components that does not include a return pathway for electrical current can be referred to as a circuit (e.g., an open loop). For example, an integrated circuit can be referred to as a circuit regardless of whether the integrated circuit is coupled to ground (as a return pathway for electrical current) or not. In various embodiments, a circuit can include a portion of an integrated circuit, an integrated circuit, a set of integrated circuits, a set of non-integrated electrical and/or electrical components with or without integrated circuit devices, or the like. In an embodiment, a circuit can include custom VLSI circuits, gate arrays, logic circuits, or other integrated circuits; off-the-shelf semiconductors such as logic chips, transistors, or other discrete devices; and/or other mechanical or electrical devices. A circuit can also be implemented as a synthesized circuit in a programmable hardware device such as field programmable gate array, programmable array logic, programmable logic device, or the like (e.g., as firmware, a netlist, or the like). A circuit can comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, can be embodied by or implemented as a circuit.

By way of introduction, the following brief definitions are provided for various terms used in this application. Additional definitions will be provided in the context of the discussion of the figures herein. As used herein, "exemplary" can indicate an example, an implementation, and/or an aspect, and should not be construed as limiting or as indicating a preference or a preferred implementation. Further, it is to be appreciated that certain ordinal terms (e.g., "first" or "second") can be provided for identification and ease of reference and may not necessarily imply physical characteristics or ordering. Therefore, as used herein, an ordinal term (e.g., "first," "second," "third") used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") can indicate "one or more" rather than "one." As used herein, a structure or operation that "comprises" or "includes" an element can include one or more other elements not explicitly recited. Thus, the terms "including," "comprising," "having," and variations thereof signify "including but not limited to" unless expressly specified otherwise. The terms "a," "an," and "the" also refer to "one or more" unless expressly specified otherwise. Further, an operation performed "based on" a condition or event can also be performed based on one or more other conditions or events not explicitly recited. As used in this application, the terms "an embodiment," "one embodiment," "another embodiment," or analogous language do not refer to a single variation of the disclosed subject matter; instead, this language refers to variations of the disclosed subject matter that can be applied and used with a number of different implementations of the disclosed subject matter. An enumerated listing of items does not imply that any or all of the items are mutually exclusive and/or mutually inclusive, unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions can be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. Other steps and methods can be conceived that are equivalent in function, logic, or effect to one or more blocks, or portions thereof, of the illustrated figures. Although various arrow types and line types can be employed in the flowchart and/or block diagrams, they are understood not to limit the scope of the corresponding embodiments. For instance, an arrow can indicate a waiting or monitoring period of unspecified duration between enumerated steps of the depicted embodiment.

As used herein, a "memory cell" comprises a hardware component that may store a single state. The memory cell may comprise a volatile or a non-volatile memory cell. The state stored in memory cell may represent one of various types of values, such as a single-bit value or a multi-bit value.

In the preceding detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure can refer to elements of proceeding figures. Like numbers can refer to like elements in the figures, including alternate embodiments of like elements.

The innovations described herein can reduce program disturb, e.g., reducing Y-mode program disturb on partial SGD (e.g., semi-circle SGD). The reduction of program disturb may allow future scaling using partial SGD, particularly for BiCS structures. This proposal is scalable and can be used even if shallow etch trench width is reduced for future scaling. This proposal maintains the VSGD margin by combining with the option of reducing VBLC_QPW for higher states. This proposal can work for SLC, TLC & QLC memory cell types.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. An apparatus, comprising:
a plurality of non-volatile memory cells configured to be programmed to multiple states, a first group of the memory cells include full select gate drains and a second group of the memory cells have partial select gate drains;
a memory controller operably connected to the plurality of memory cells and configured to:
designate as selected a first string of non-volatile memory cells for a program operation with the first string being part of the first group,
designate as unselected a second string of non-volatile memory cells for the program operation with the second string being part of the second group with the second string being adjacent the first string,
bias the second string to zero volts,
bias the full select gate drains of the first string to a full voltage level at lower program states for the first string, and
bias the full select gate drain of the first string to a lower voltage level than the full voltage level at higher program states for the first string, the higher program states being higher than the lower program states to reduce program disturb on the second string.

2. The apparatus of claim 1, wherein the memory controller is configured to bias a selected bitline to address a memory cell in the first string at a lower voltage for the higher programming states and a higher voltage for the lower programming states.

3. The apparatus of claim 2, wherein the memory controller is configured to lower a bias voltage on the selected bitline by a difference between the higher program state and the lower program state applied to the full select gate drain of the first string.

4. The apparatus of claim 3, wherein the memory controller is configured to quick pass write data to the memory cell addressed by the selected bitline with a reduced quick pass write bitline voltage compared to a non quickpass write bitline voltage and to reduce a bias voltage to the full select gate drain by a similar voltage as the difference between the reduced quick pass write bitline voltage compared to the non quickpass write bitline voltage.

5. The apparatus of claim 1, wherein the memory controller applies the full voltage level to the lower program states, reduces bias voltage on the selected bitline for middle program states to a middle bias voltage level and further reduces bias voltage to the lower voltage level on the selected bitline for the high program states.

6. The apparatus of claim 5, wherein the memory cells are quad level cells and the lower program states include at least an A program state and a B program state, the middle program states include at least a D program state, and the high program states include at least a G program state.

7. The apparatus of claim 6, wherein the full voltage level is 2.4 volts, the middle voltage level is 2.3 volts, and the lower voltage level is 2.0 volts.

8. The apparatus of claim 1, wherein the memory controller is configured to reduce the bias voltage level at the unselected partial SGD by a similar value as a voltage reduction applied to the bit lines in a quick pass write programming loop.

9. The apparatus of claim 8, wherein the memory controller is configured to reduce the bit line voltage from a full level at programming loops for the lower program states to a middle bit line programming voltage for the middle program state and further reduce the bit line programming voltage for the highest program states.

10. The apparatus of claim 1, wherein the partial select gate drains are semicircular and the full select gate drains are circular.

11. A nonvolatile memory control method, comprising:
reducing program disturb to a neighboring partial select gate drain to the full select gate drain by applying multiple voltage levels including:
applying a first voltage level to a full select gate drain as part of a memory string to program low data states;
applying a second voltage level to the full select gate drain as part of the memory string to program intermediate data states, the second voltage level being less than the first voltage level by a first voltage difference;
applying a third voltage level to the full select gate drain as part of the memory string to program a high data state, the third voltage level being less than the second voltage level by a second voltage difference;
applying bias voltages to bitlines that reduce by the voltage difference and the second voltage difference from programming the intermediate data states and the high data state, respectively.

12. The method of claim 11, wherein the first voltage difference is about 0.2 volts and the second voltage difference is about 0.4 volts.

13. The method of claim 11, further comprising performing quick pass write using the first voltage level, the second voltage level, and the third voltage level.

14. The method of claim 11, further comprising applying the first voltage level, the second voltage level, and the third voltage level to a single full select gate drain and the remaining select gate drain being unselected with the partial select gate drain to reduce program disturb due to an uncovered channel in the partial select gate drain.

15. The method of claim 11, further comprising applying a bitline voltage to a selected bitline connected to both the partial select gate drain and the full select gate drain.

16. An apparatus, comprising:
a plurality of non-volatile memory cells configured to be programmed to multiple states, a first group of the memory cells include full select gate drains (SGD) and a second group of the memory cells have semicircle select gate drains that are partially cut by a shallow trench etch;
a memory controller operably connected to the plurality of memory cells and configured to:
apply a full program voltage level to a selected SGD during programming loops for lowest data states,
apply an intermediate program voltage level to the selected SGD during programming loops for intermediate data states, the intermediate program voltage level being less than the full program voltage level, and
apply a lower program voltage level to the selected SGD during programming loops for the lowest data states, the lowest program voltage level being less than the intermediate program level.

17. The apparatus of claim 15, wherein the memory controller is configured to reduce the voltage levels to the selected SGD by about a same voltage reduction applied to the bit line.

18. The apparatus of claim 16, wherein the memory controller is configured to reduce the bit line voltage by 0.2 volts from the lowest data states to the intermediate data states and 0.4 volts from the intermediate data states to the highest data states.

19. The apparatus of claim 17, wherein the memory controller is configured to set the intermediate voltage at 2.2 volts.

20. The apparatus of claim 19, wherein the memory controller is configured to set the lowest program voltage to 2.0 volts.

* * * * *